US012812968B2

(12) United States Patent
Lin et al.

(10) Patent No.: US 12,812,968 B2
(45) Date of Patent: Nov. 24, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Tzu-Ging Lin, Kaohsiung (TW); Hung-Yu Lin, Hsinchu (TW); Chia-Chin Lee, Hsinchu (TW); Chun-Liang Lai, Hsinchu (TW); Yun-Chen Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 420 days.

(21) Appl. No.: 18/602,354

(22) Filed: Mar. 12, 2024

(65) Prior Publication Data

US 2025/0142951 A1 May 1, 2025

Related U.S. Application Data

(60) Provisional application No. 63/593,723, filed on Oct. 27, 2023.

(51) Int. Cl.

| | |
|---|---|
| ***H10D 84/85*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |

(52) U.S. Cl.

CPC .......... *H10D 84/85* (2025.01); *H10D 30/014* (2025.01); *H10D 30/43* (2025.01); *H10D 30/6735* (2025.01); *H10D 62/121* (2025.01); *H10D 64/017* (2025.01); *H10D 84/0188* (2025.01); *H10D 84/038* (2025.01)

(58) Field of Classification Search

CPC ......... H10D 84/85; H10D 30/01; H10D 30/43

See application file for complete search history.

(56) References Cited

U.S. PATENT DOCUMENTS 10,720,526 B2 7/2020 Ko et al.

FOREIGN PATENT DOCUMENTS

TW 202333375 8/2023

*Primary Examiner* — Marvin Payen

(74) *Attorney, Agent, or Firm* — NZ Carr Law Office

(57) ABSTRACT

Embodiments of present disclosure relates to forming isolation structures in gate structures to prevent current leakage through source/drain regions (EPI), transistors, and silicon substrate. The isolation structures are arranged in a pattern with a long isolation structure adjacent a short isolation structure. The isolation structures may be formed in the gate structure prior to or after the replacement gate sequence.

20 Claims, 29 Drawing Sheets

SEMICONDUCTOR DEVICE STRUCTURE AND METHODS OF FORMING THE SAME

CROSS-REFERENCE TO RELATED APPLICATIONS

This application claims priority to United States Provisional Patent Application Ser. No. 63/593,723, filed Oct. 27, 2023, which is incorporated by reference in its entirety.

BACKGROUND

As the semiconductor industry has progressed into nanometer technology process nodes in pursuit of higher device density, higher performance, and lower costs, challenges from both fabrication and design issues have resulted in the development of multi-gate devices, such as fin field-effect transistors (FinFETs) and gate-all-around (GAA) transistors. To continue to provide the desired scaling and increased density for multi-gate devices in advanced technology nodes, continued reduction of the gate pitch is necessary.

Device layout may adopt polycrystalline silicon (poly) segments formed as diffusion edge (PODE) or continuous poly on diffusion edge (COPED) to avoid leakage between neighboring devices. A PODE pattern or a CPODE pattern is used to form the poly segments. As device dimension scales down, such as gate pitch, design schemes, such as PODE and CPODE schemes, may face difficulties to provide the level of device density, cell isolation, and device performance required for aggressively scaled circuits and devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
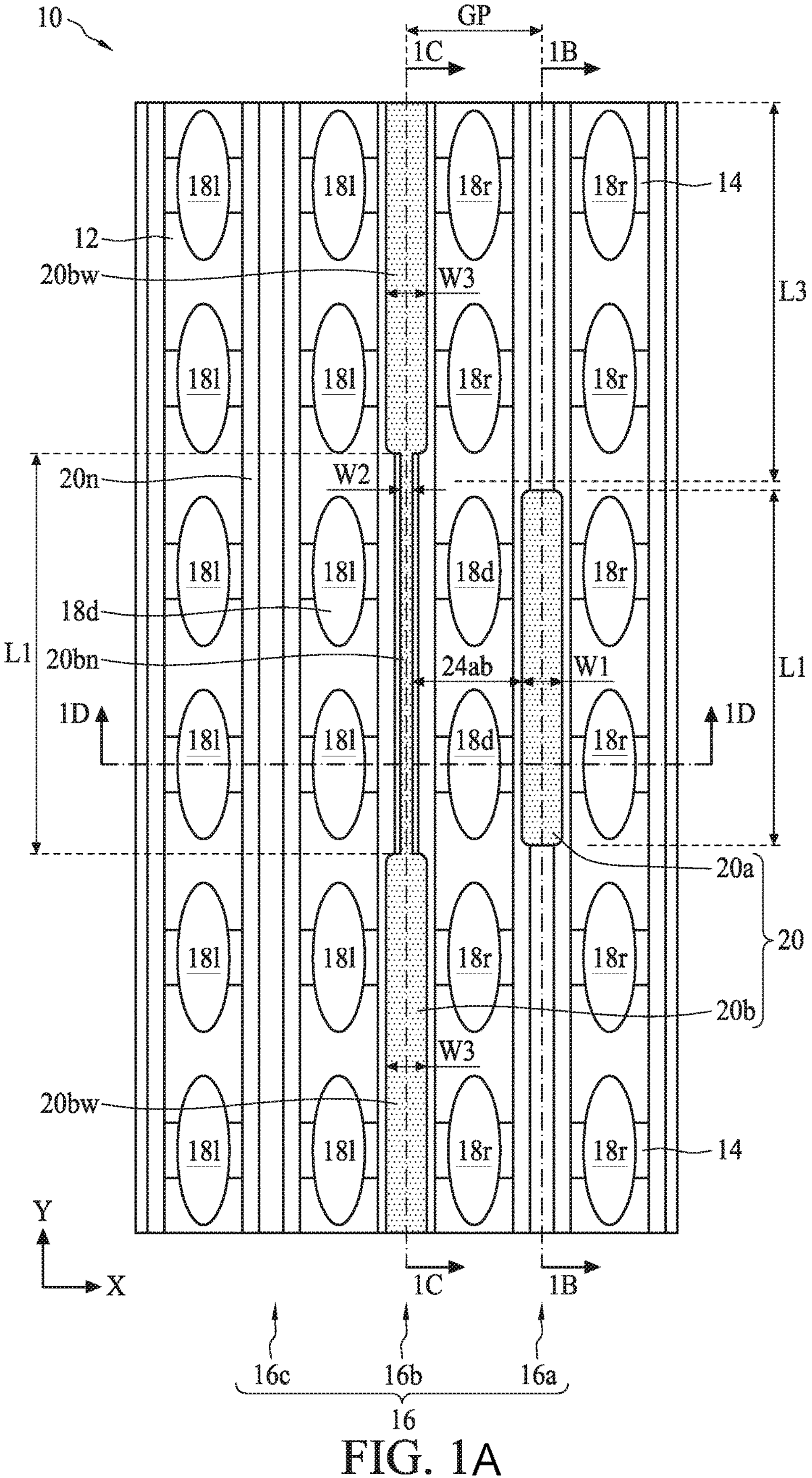
FIGS. 1A-1D schematically demonstrate a patterning design of isolation structures according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain region refers to a source and/or a drain. A source and a drain are interchangeably used.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

Embodiments of present disclosure relates to forming isolation structures in gate structures to prevent current leakage through source/drain regions (EPI), transistors, and silicon substrate. The isolation structures may be formed in the gate structure prior to or after the replacement gate sequence. Continuous polysilicon on diffusion edge (CPODE) processes, which involves silicon gate etch processes, may be performed prior to the replacement gate sequence. Continuous metal on diffusion edge (CMODE) processes, which involves metal gate etch processes, may be performed after the replacement gate sequence.

Embodiments of the present disclosure relate to method for used to patterning process for CPODE or CMODE to avoid photoresist peeling or pattern merge. A plurality of fin structures are first formed along a x-direction. Each fin structure may include one type of epitaxial semiconductor material for FinFET structure or multiple layers of epitaxial semiconductor layers of GAA structures. Multiple gate structures are then formed over the fin structures along a y-direction. The gate structures have a gate pitch along the x-direction. Source/drain regions are then formed along the fin structures and between the gate structures. A CPODE or CMODE opening pattern is first formed in a hard mask layer. The CPODE or CMODE pattern includes a group of isolation openings along a group of adjacent gate structures, i.e. along the y-direction. An isolation material is then filled in place of the removed portions of the semiconductor substrate, the fin structures, and the gate structures.

According to embodiments of the present disclosure, the CPODE or CMODE pattern includes isolation openings having various lengths along the y-direction. In some embodiments, the CPODE or CMODE pattern includes a long isolation trench and a short isolation trench disposed adjacent to each other. The short isolation trench overlaps with a portion of the long isolation trench. In some embodiments, the portion of the long isolation trench which overlaps with the short isolation trench has a reduced width along the x-direction.

In some embodiments, the hard mask layer is configured to apply tensile stress to the semiconductor substrate. In some embodiments, a passivation-oriented etch process is performed to transfer the CPODE or CMODE pattern from the hard mask layer to the semiconductor substrate.

As the gate pitch decreases, the variation in width of the isolation openings avoids photoresist peeling, pattern merge and pattern loading in subsequent processes. The arrangement of a short trench adjacent a long trench, applying tensile stress to the substrate, and using passivation-oriented etch process result in a greater etch depth into the substrate therefore ensures isolation between the source/drain regions and transistors.

Figure 1B:
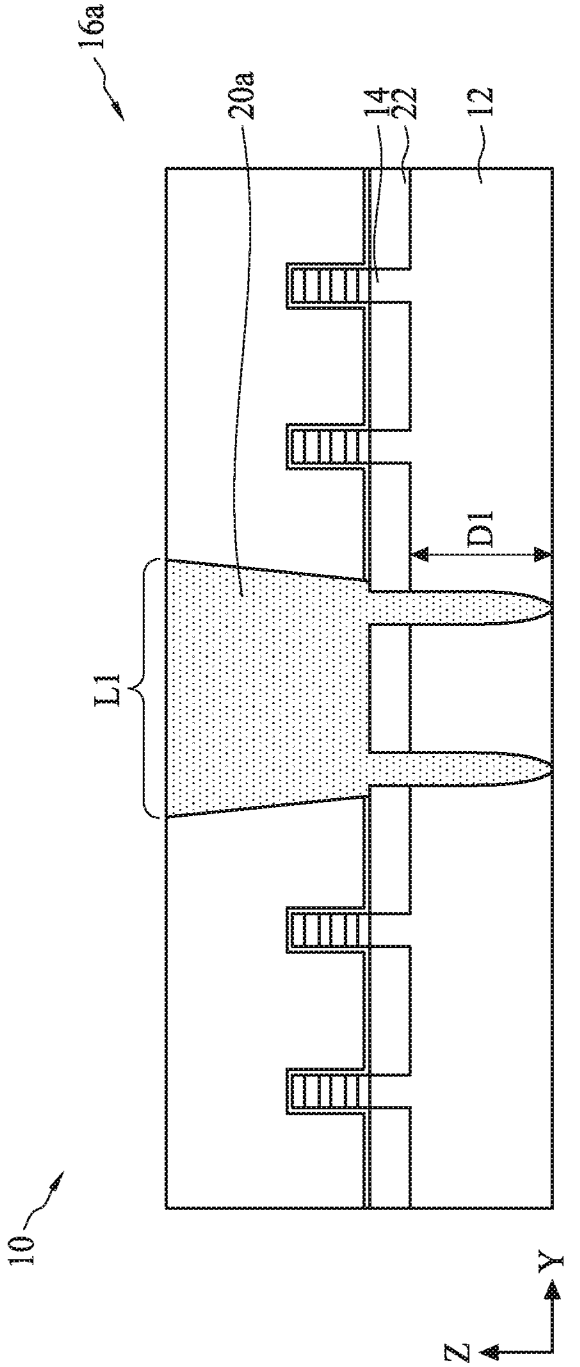
Figure 1C:
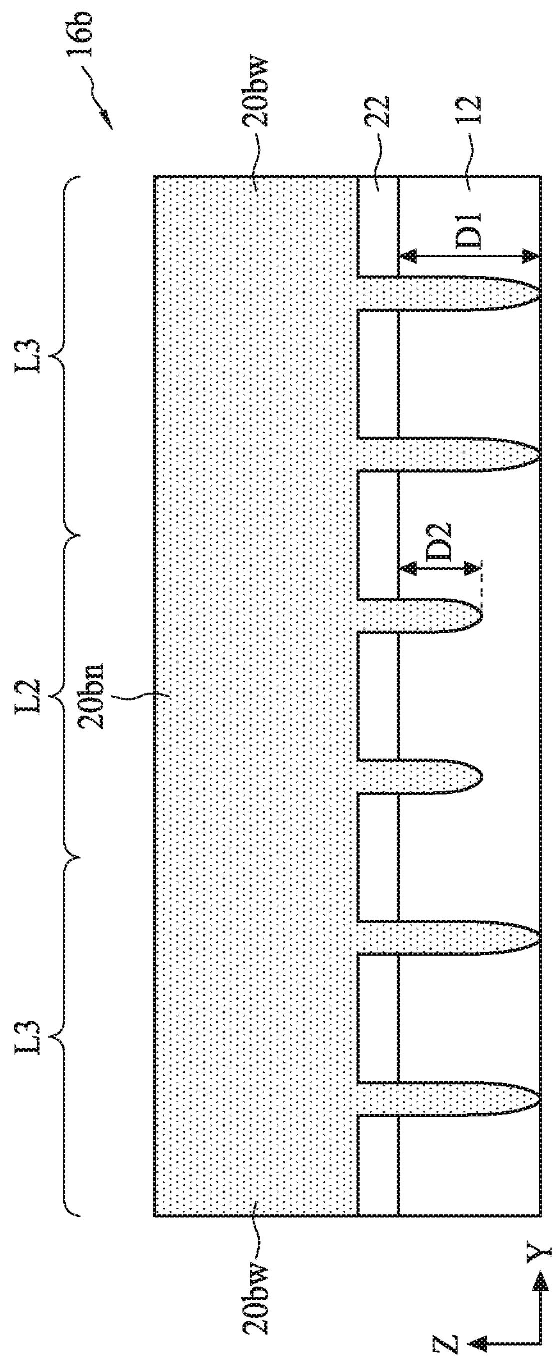
Figure 1D:
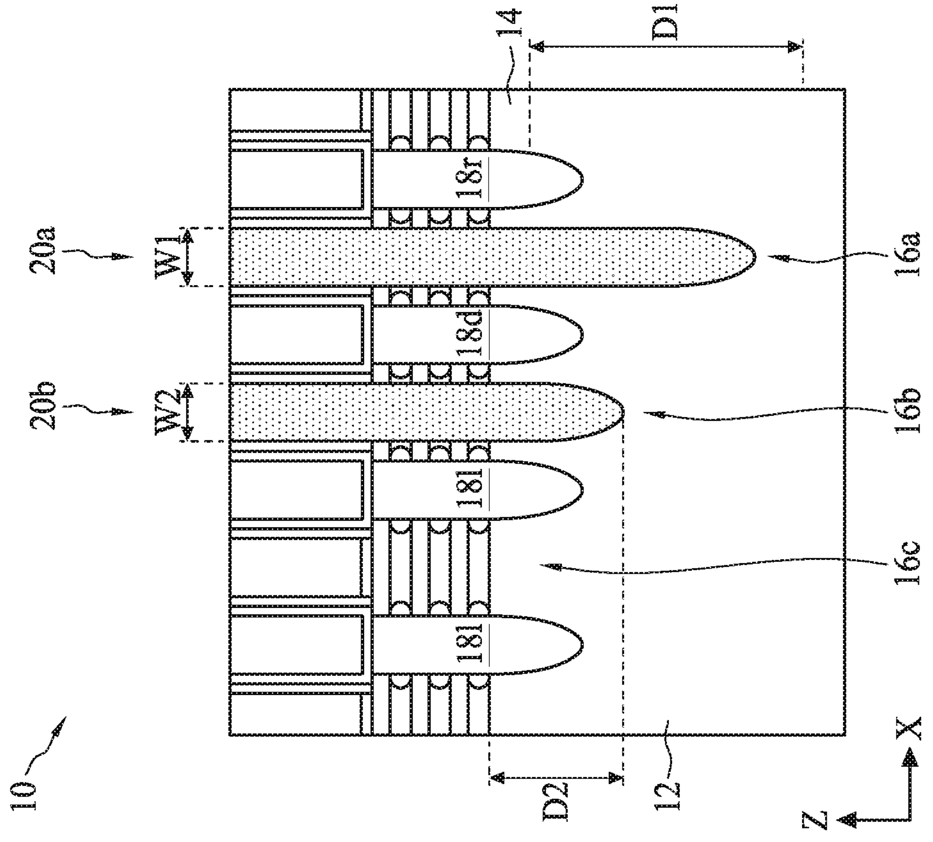

FIGS. 1A-1D schematically demonstrate a patterning design of isolation structures according to embodiments of the present disclosure. FIG. 1A is a schematic top view of a semiconductor device 10 according to the present disclosure. FIGS. 1B, 1C and 1D are schematic cross sectional view of the semiconductor device 10 along lines 1B-1B, 1C-1C, and 1D-1D in FIG. 1A respectively.

The semiconductor device 10 includes a plurality of transistors formed in and on a semiconductor substrate 12. Particularly, the semiconductor device 10 includes a plurality of fin structures 14 formed on the semiconductor substrate 12 along the x-direction. The fin structures 14 may include a single channel (for FinFET devices) or multiple channels (for GAA devices). A plurality of gate structures 16 (16*a*, 16*b*, 16*c*, collectively 16) formed over the fin structures 14 along the y-directions. Source/drain regions 18 are formed from the fin structures 14 between the gate structures 16. The gate structures 16 have a gate pitch GP. In some embodiments, the gate pitch GP is less than 50 nm, for example, the gate pitch is between about 20 nm and about 30 nm. The gate structures 20 may have a gate width GW along the x-direction. The source/drain regions 18 and the gate structures 16 in between form transistors. Isolation structures 20 are formed in portions of the gate structures 16 and extend into the semiconductor substrate 12 thereby electrically isolate the source/drain regions 18 on opposite sides of the isolation structures 20 (isolation structures 20*a*, 20*b*, 20*c* are shown, collectively isolation structure 20). The isolation structures 20 may be formed by a CPODE process or a CMODE process.

As shown in FIG. 1A, the isolation structures 20*a*, 20*b* are formed side-by-side in continuously adjacent gate structures 16*a*, 16*b*. The isolation structure 20*a*, 20*b* replace a portion of the gate structures 16*a*, 16*b*, cuts the fin structure 14 underneath, and extends into the semiconductor substrate 12. The isolation structures 20*a*, 20*b* cut the fin structures 14 and electrically isolate the source/drain regions 181 to the left side from the isolation regions 18*r* to the right side. The source/drain regions 18 between the isolation structures 20 become dummy source/drain regions 18*d*.

During formation of the isolation structures 20 by a CPODE process or a CMODE process, a hard mask is first formed over the gate structures 16, followed by a photolithography process to form mask openings in the hard mask. Embodiments of the present disclosure provide a CPODE or CMODE pattern that avoid photoresist pill and enable trench formation for isolation structures to prevent current leakage. It has been observed that a mask opening with a wider width along the x-direction results in a larger etch depth in the semiconductor substrate 12 while a mask opening with a narrower width along the x-direction results in a smaller etch depth in the semiconductor substrate 12.

As the gate pitch reduces, it becomes increasingly challenging to form mask openings side-by-side. For example, photoresist defects, such as peeling and scum, may occur. A gate pattern may include a 1D gate pitch and 2D gate pitch. The 1D gate pitch refers to the pitch along the direction of the fin structures, i.e., the x-direction. The 2D gate pitch refers to the pitch along the direction perpendicular to the fin structures, i.e., the y-direction. The gate pitch discussed hereafter refers to the 1D gate pitch. It also has been observed that the mask spacing along for x-direction needs to be smaller than about 50% of the 1D gate pitch to avoid peeling. When the gate pitch reduces, the mask spacing width may need to be greater than 50% of the gate pitch to achieve sufficient etch depth in the semiconductor substrate 12 to provide isolation. Embodiments of the present disclosure provide mask opening design that avoid photoresist defects without compromise isolation function.

In some embodiments, the isolation structures 20 are formed in two or more neighboring gate structures 16. In some embodiments, the isolation structures 20 formed in two or more neighboring gate structures 16 have different lengths along the y-direction. For example, a long isolation structure 20 is positioned adjacent and parallel to a short isolation structures 20. By arranging a short isolation structure 20 next to a long isolation structure 20, the isolation structures 20 may be formed without causing photoresist defects. The short isolation structure and the long isolation structure overlap with each other. In some embodiments, the short isolation structure overlaps with the long isolation structure along its entire length. In some embodiments, the long isolation structure may include a narrow segment, which overlaps with the short isolation structure.

As shown in FIG. 1A, the isolation pattern may include a short isolation structure 20*a* formed along the gate structure 16*a*, and a long isolation structure 20*b* formed along the gate structure 16*b*. The gate structures 16*a* and 16*b* may be immediately adjacent to each other. The short isolation structure 20*a* and the long isolation structure 20*b* may overlap for a length.

In some embodiments, the isolation structures 20 within one gate structure 16 may include a single segment with one width in the x-direction. For example, the short isolation structure 20*a* has a single width along its entire length. The short isolation structure 20*a* has a length L1 along the y-direction and a width W1 along the x-direction. In some embodiments, the width W1 is greater than about 50% of the gate pitch GP. For example, the width W1 is in a range between about 0.5 GP and about 0.6 GP. The length L1 of the short isolation structure 20*a* may be in a range between about 2 times of W1 and 10 times of W1. The length L1 may be chosen according to the circuit design. In some embodiments, the length L1 may be selected to ensure that the isolation structure 20*a* reaches sufficient depth in the semiconductor substrate 12.

In some embodiments, the isolation structure 20 in one gate structure 16 may include two or more segments with different widths. For example, the long isolation structures 20*b* has segments of different widths. In the example of FIG. 1A, the long isolation structure 20*b* has a narrow segment 20*bn*, and at least one wide segments 20*bw* extending from the narrow segment 20*bn*. In some embodiments, the narrow segment 20*bn* of the long isolation structure 20*b* overlaps with the short isolation structure 20*a*. In some embodiments, the narrow segment 20*bn* has a width W2 along the x-direction and a length L2 along the Y-direction. The wide segment 20*b*2 has a width W3 along the x-direction and a length L3 along the y-direction. The width W2 is less than the width W1 and the width W3. In some embodiments, the width W3 is in a range between about 0.5 GP and about 0.6 GP. The width W2 is in a range between about 0.25 GP and 0.5 GP. In some embodiments, the width W1 and the width W2 are selected so that the average widths of the isolation structures 20 is less than 0.5 GP, for example, the average width of the isolation structures 20 is between about 0.4 GP and 0.45 GP.

In some embodiments, the length L2 is equal to or greater than the length L1 so that the narrow segment 20*bn* of the long isolation structure 20*b* overlaps with the entire length L1 of the short isolation structure 20*a*. By positioning the short isolation structure 20*a*, which includes a wide segment, immediately adjacent to the narrow segment 20*bn* of the long isolation structure, embodiments of the present disclosure ensures that the short isolation structure 20*a* has enough width to reach sufficient depth to provide isolation across the fin structure 14 without causing photoresist defects during fabrication. In some embodiments, the length L3 may be long enough to cover one or more fin structures 14.

The short isolation structure 20*a* may extend across one or more fin structures 14. As shown in FIG. 1B, the fin structures 14 are formed over the semiconductor substrate 12. A lower portion of the fin structures 14 are surrounded by a shallow trench isolation (STI) layer 22. The isolation structure 20*a* cuts up the two fin structures 14 underneath and extends into the semiconductor substrate 12. In some embodiments, the isolation structure 20*a* extends into the semiconductor substrate 12 for a depth D1 along the z-direction. The depth D1 is selected to ensure that the isolation structure 20*a* electrically isolate the source/drain region 181 from the source/drain region 18*r*, as shown in FIG. 1A. In some embodiments, the depth D1 is in a range between about 20 nm and about 90 nm.

The long isolation structure 20*b* is immediately adjacent the insolation structure 20*a*. The isolation structure 20*b* includes two wide segments 20*bw* connected by the narrow segment 20*bn*. The narrow segment 20*bn* has a length L2 or a length substantially equal to the short isolation structure 20*a*, therefore, providing a spacing 24*ab* that is wider than about 50% of the gate pitch GP. The wide segments 20*bw* are formed from two ends of the narrow segment 20*bn*. Alternatively, the long isolation structure 20*b* may include only one wide segment 20*bw* and one narrow segment 20*bn*. The wide segments 20*bw* may have a length L3. The length L3 may be long enough to cover one or more fin structures 14. As shown in FIG. 1C, the long isolation structure 20*b* cuts up the four fin structures 14 underneath and extends into the semiconductor substrate 12. In some embodiments, the narrow segment 20*bn* of the long isolation structure 20*b* extends into the semiconductor substrate 12 for a depth D2 along the z-direction while the wide segments 20*bw* of the long isolation structures 20*b* extend into the semiconductor substrate for a depth D1. The depth D2 is less than the depth D1. In some embodiments, the depth D2 is in a range between about 0 nm and about 70 nm. In some embodiments, the difference between D1 and D2 is less than about 60 nm. In some embodiments, a ratio of D1:D2 is in a range between about 1.2 and about 3.0, for example between about 1.5 and about 2.0.

In some embodiments, at the depth D2, the isolation structure 20*b* may not be sufficient to isolate the source/drain regions 18 on opposing sides of the isolation structure 20*b*. Thus, the wide segments 20*bw* of the long isolation structure 20*b* provide electric isolation across the fin structures 14 underneath. The narrow segment 20*bn* of the isolation structure 20*b* does not provide electric isolation across the fin structures 14 underneath. The fin structures 14 under the narrow segment 20*bn* of the long isolation structure 20*b* rely on the short isolation structure 20*a* for electrical isolation.

Figure 2A:
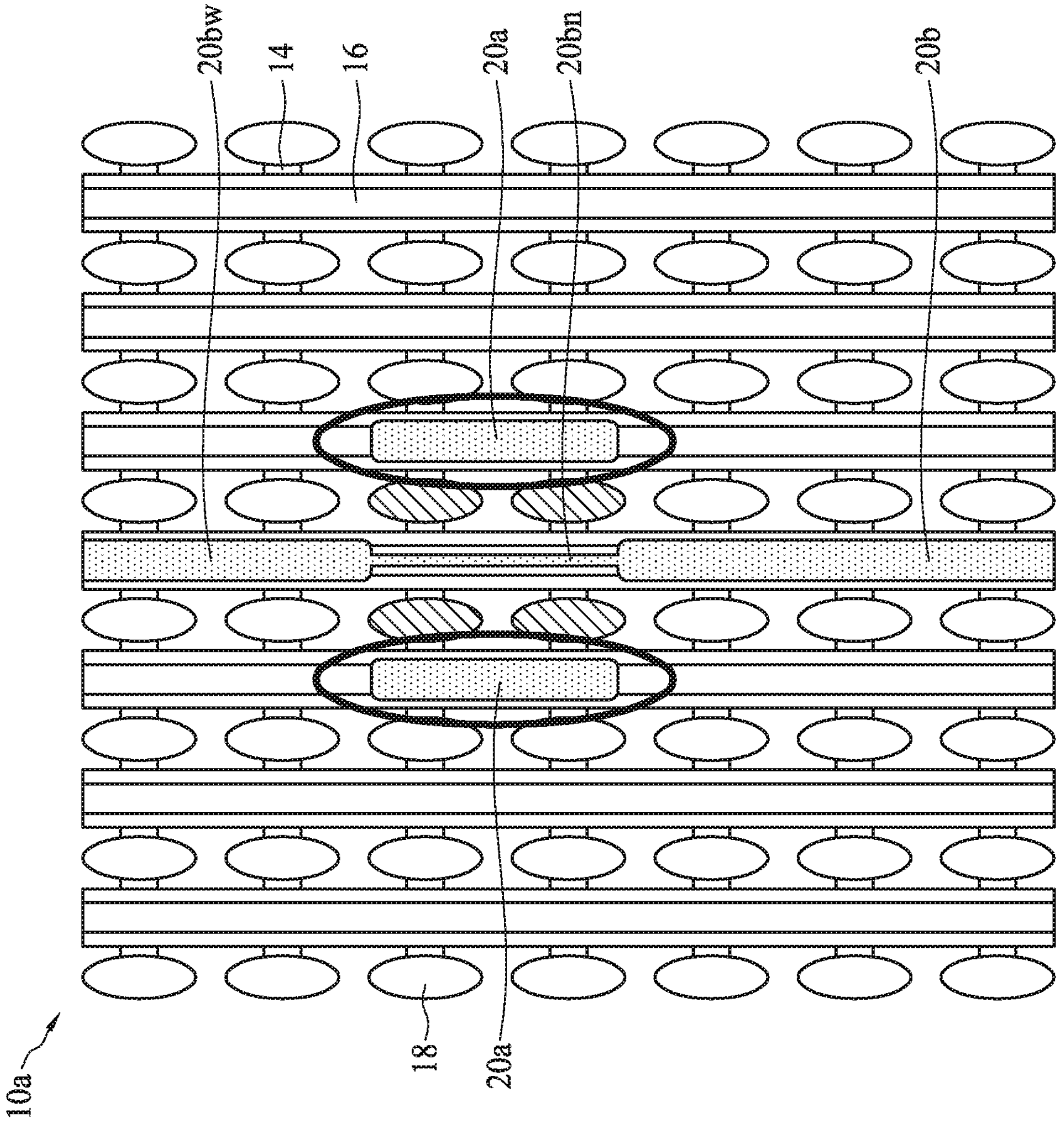
FIGS. 2A-2C schematically demonstrate variation of the patterning designs of isolation structures according to embodiments of the present disclosure.
Figure 2B:
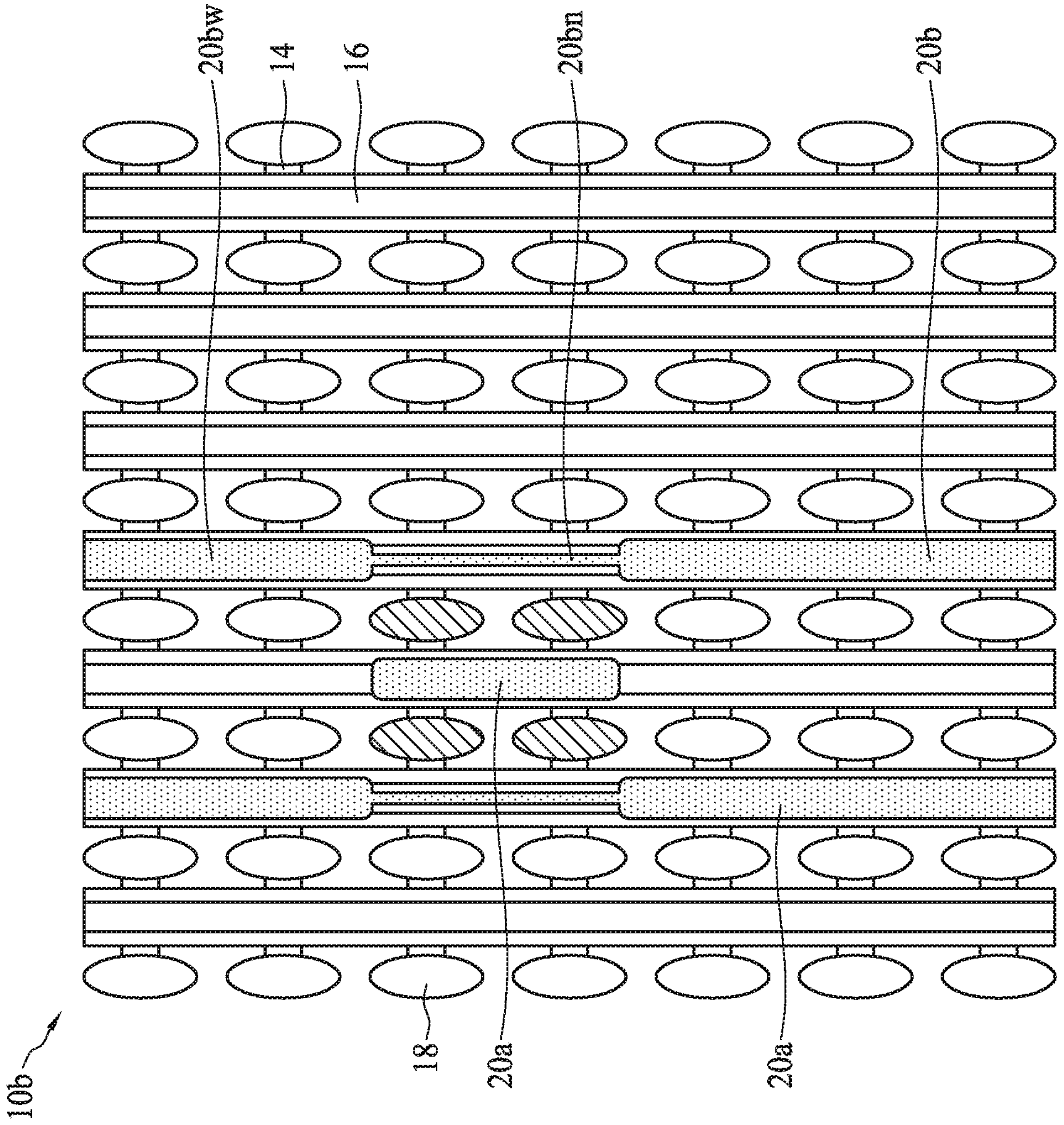
Figure 2C:
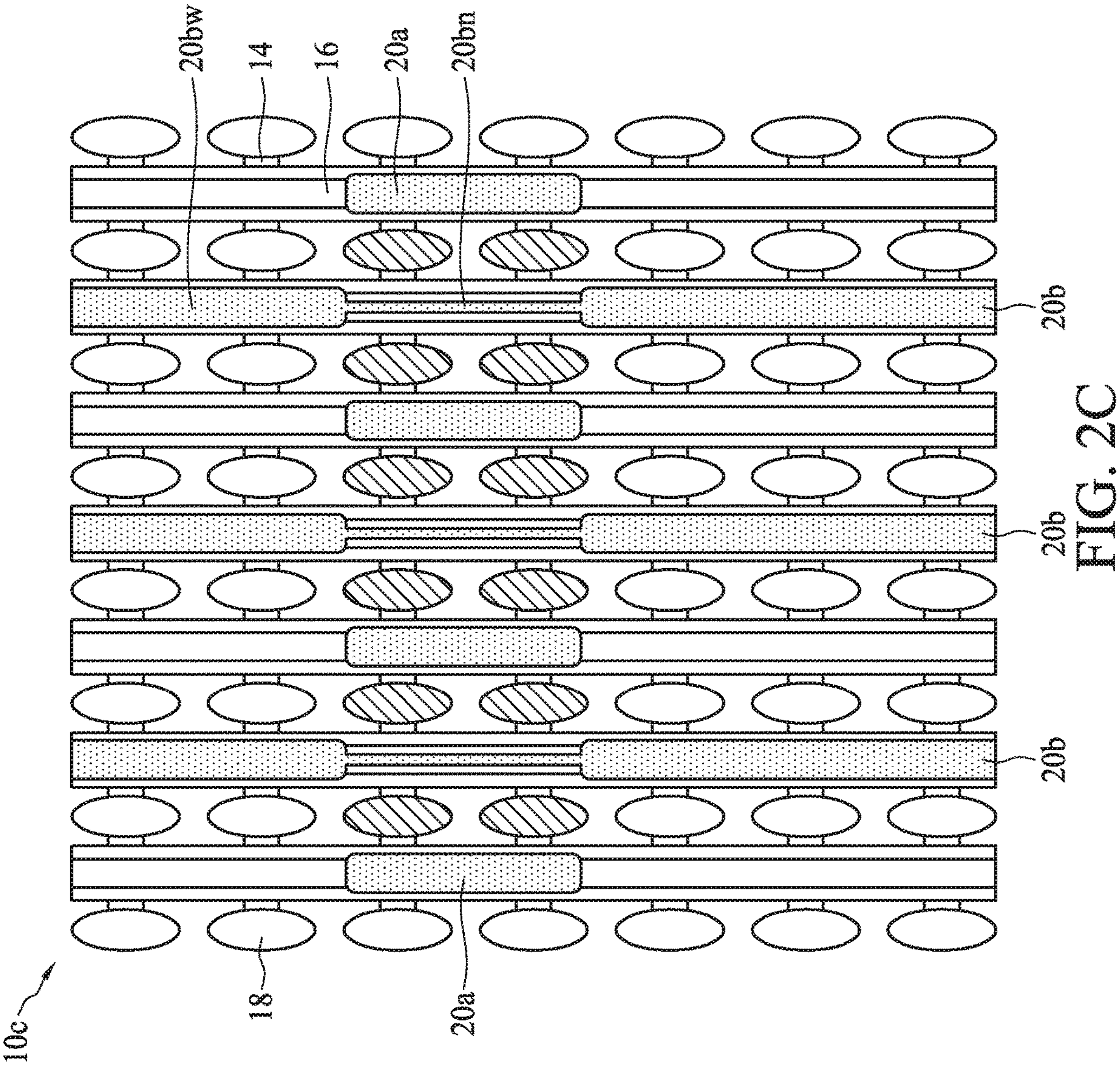

As discussed above, embodiments of the present disclosure arrange short isolation structures and long isolation structures to achieve effective isolation and avoid photoresist defects at the same time. The short and long isolation may be arranged in various designs. FIGS. 2A-2C schematically demonstrate variation of the patterning designs of isolation structures according to embodiments of the present disclosure.

FIG. 2A is schematic top view of a semiconductor device 10*a* according to embodiments of the present disclosure. The semiconductor device 10*a* is similar to the semiconductor device 10 with a different arrangement of short and long isolation structures. In the semiconductor device 10, one short isolation structure 20*a* is placed on one side of a long isolation structure 20*b*. In the semiconductor device 10*a*, two short isolation structures 20*a* are disposed on opposing sides of the long isolation structure 20*b*. In FIG. 2A, the long isolation structure 20*b* includes a narrow segment 20*bn* and the two short isolation structures 20*a* are positioned on opposite sides of the narrow segment 20*bn*.

FIG. 2B is schematic top view of a semiconductor device 10*b* according to embodiments of the present disclosure. The semiconductor device 10*b* is similar to the semiconductor device 10 with a different arrangement of short and long isolation structures. In the semiconductor device 10*b*, two long isolation structures 20*b* are disposed on opposing sides of one short isolation structure 20*a*. In FIG. 2B, at least one of the long isolation structures 20*b* includes a narrow segment 20*bn*, and the short isolation structure 20*a* is positioned next to the narrow segment 20*bn*.

FIG. 2C is schematic top view of a semiconductor device 10*c* according to embodiments of the present disclosure. The semiconductor device 10*c* is similar to the semiconductor device 10 with a different arrangement of short and long isolation structures. In the semiconductor device 10*c*, two or more long isolation structures 20*b* and two or more short isolation structures 20*a* are alternatively disposed. Each of the long isolation structures 20*b* includes a narrow segment 20*bn*, and the short isolation structures 20*a* are positioned in adjacent the narrow segments 20*bn*.

In addition to adopting an insolation pattern having a short isolation structure adjacent a long isolation structure, embodiments of the present disclosure further applying stress to the semiconductor during patterning and using a passivation-oriented etch process to improve performance.

Figure 3A:
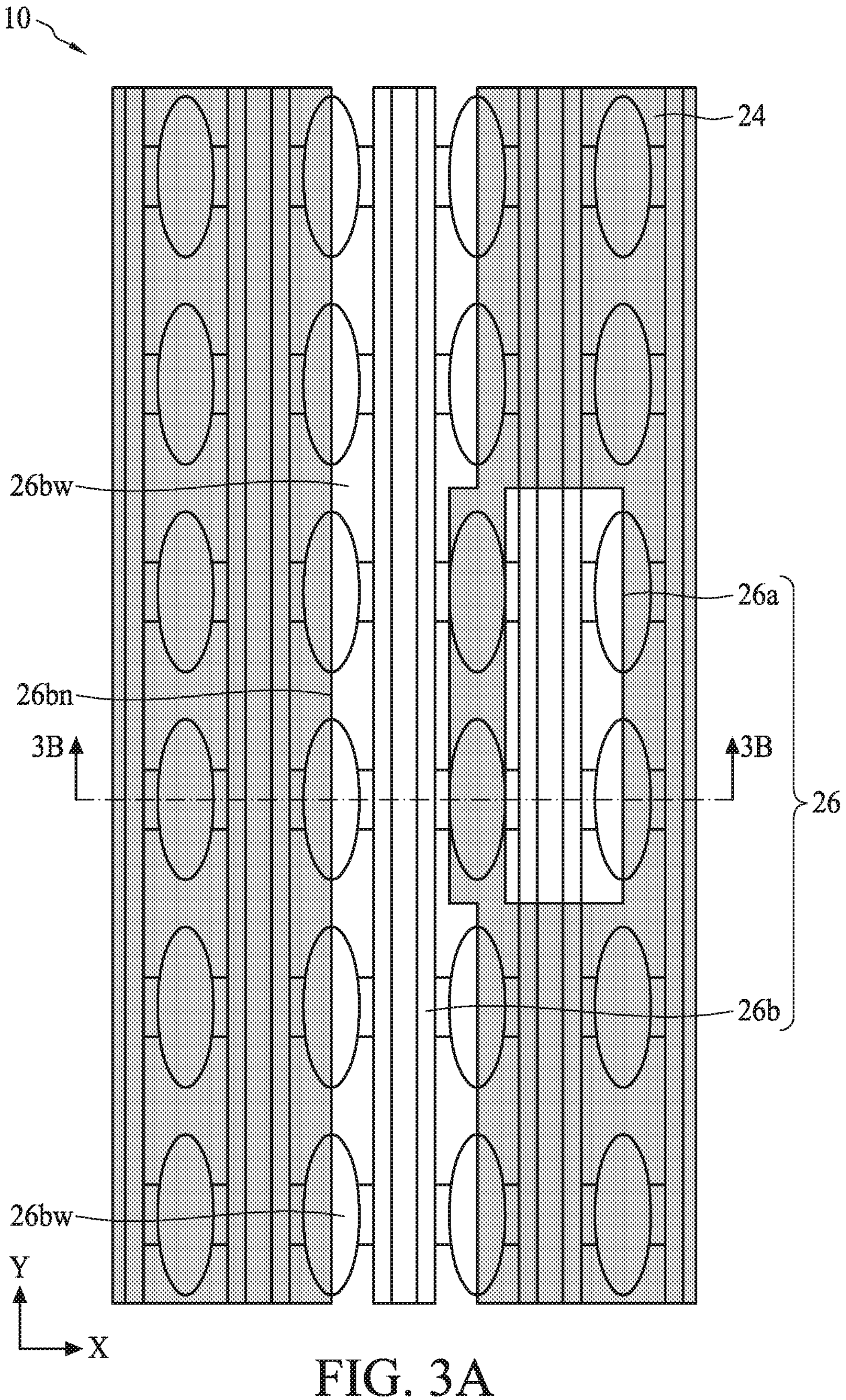
FIG. 3A is a schematic top view of a semiconductor device showing the patterning design formed in a photoresist layer.
Figure 3B:
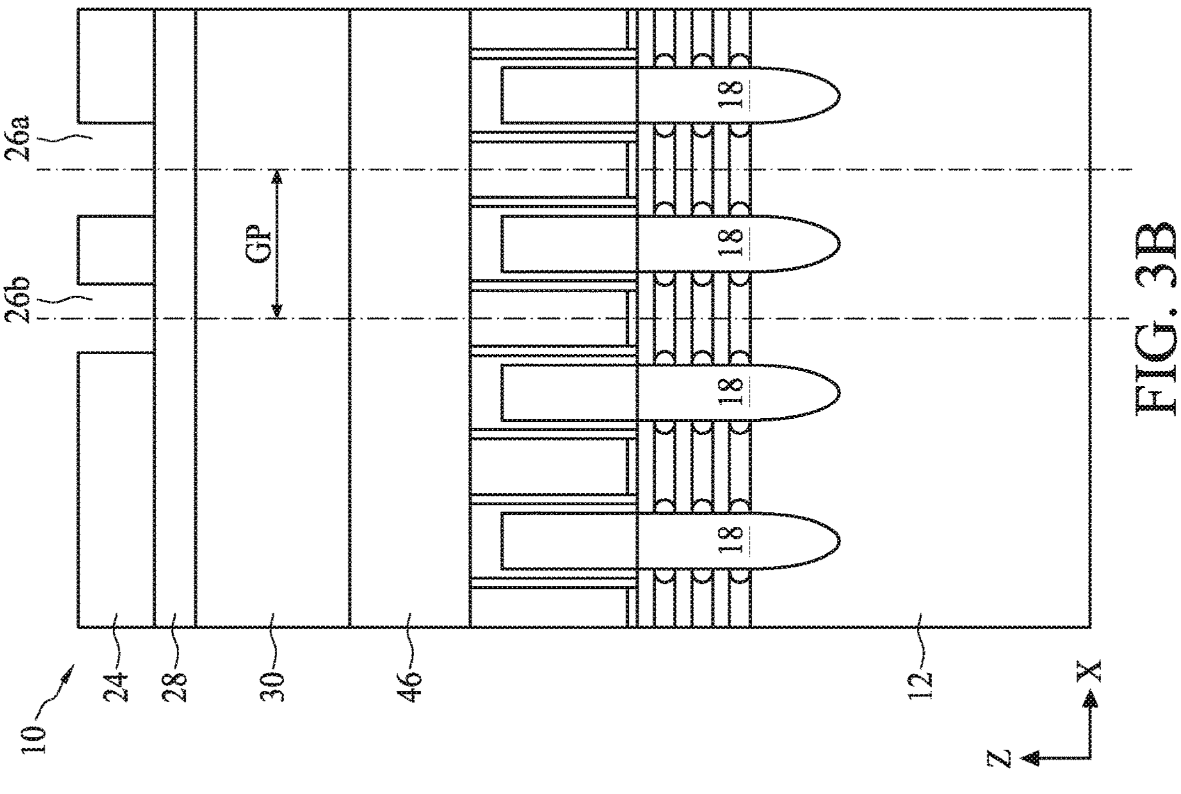
FIG. 3B is a schematic cross sectional view of the semiconductor device along the line 3B-3B in FIG. 3A.

FIG. 3A is a schematic top view of the semiconductor device 10 showing the patterning design formed in a photoresist layer. FIG. 3B is a schematic cross sectional view of the semiconductor device 10 along the line 3B-3B in FIG. 3A. As shown in FIGS. 3A-3B, prior to forming the isolation pattern, a mask layer 46 and a tri-layer photoresist layer are sequentially deposited over the semiconductor device 10. The tri-layer photoresist layer may include a carbon based bottom layer 30, an oxide based middle layer 28, and a top photoresist layer 24. After a photolithography process, an after-development pattern is formed in the photoresist layer 24, as shown in FIGS. 3A and 3B. The after-development pattern is similar to the isolation pattern eventually formed in the semiconductor device 10 with some differences to accommodate pattern transfer rules. In some embodiments, the after-development pattern may include a short opening 26*a* disposed adjacent a long opening 26*b*. In some embodiments, the long opening 26*b* may include a narrow segment 26*bn* and two wide segments 26*bw* extending from the narrow segment 26*bn*. The narrow segment 26*bn* of the long opening 26*b* overlaps with the short opening 26*a* along the y-direction.

Figure 3C:
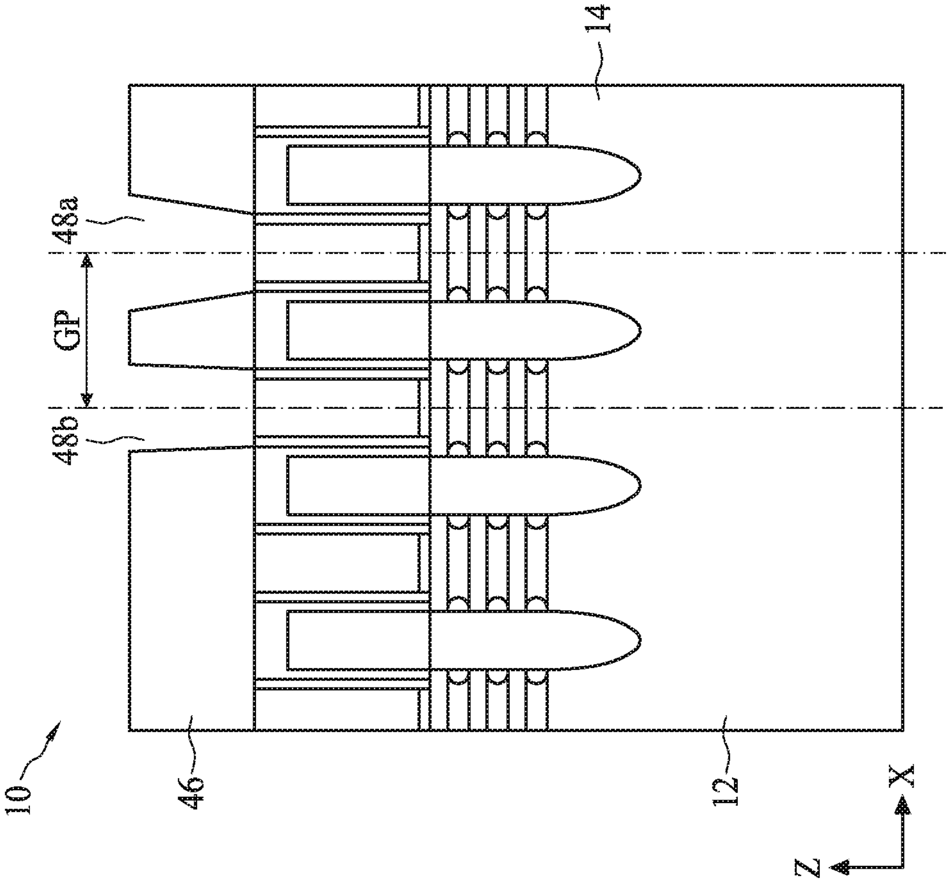
FIG. 3C is a schematic cross sectional view of the semiconductor device of FIG. 3A after the patterning design is transformed to a mask layer.

The after-development pattern is then transferred to the mask layer 46 using one or more etch processes. FIG. 3C is a schematic cross sectional view of the pattern transformed to the mask layer 46. As shown in FIG. 3C, openings 48*a*, 48*b* are formed through the mask layer 46. The openings 48*a*, 48*b* may be collectively referred to as after-hard mask pattern. There are etch biases or differences between the after-development pattern and the after-hard mask pattern because of process limitation. However, the amount of bias between the patterns varies due to variation of pattern density and feature dimension. In other words, etch bias loading exists because of the pattern density and feature dimension variation. Embodiments of the present disclosure reduces the etch bias loading using the combination of long and short features, and a hard mask layer 46 that exerts tensile stress towards the semiconductor substrate 12.

Figure 4A:
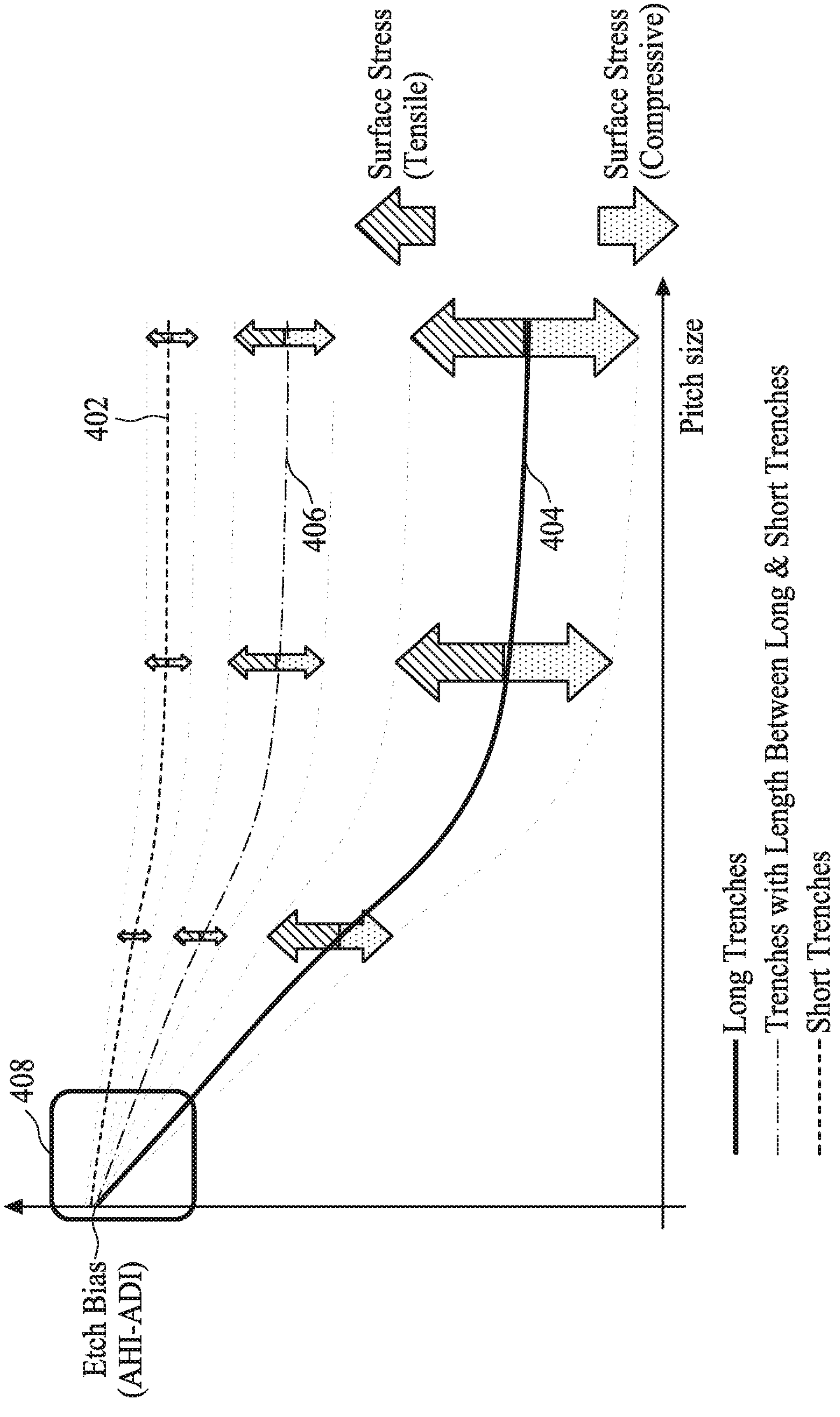
FIG. 4A schematically etch bias in patterning a hard mask layer under different process conditions.

FIG. 4A schematically demonstrates loading of etch bias in patterning a hard mask layer under different process conditions. The x-axis of FIG. 4A indicates pitch size. For example, the gate pitch GP in the semiconductor device 10 indicates the pitch size of the isolation openings 20. The y-axis indicates the amount of etch bias, which is calculated between the after-development pattern, obtained from after-development inspection, and the after-hard mask pattern, obtained from after hard mask etching inspection. As shown FIG. 4A, the etch bias increase with pitch size. In other word, the etch bias is higher when the feature size is large and pattern density is low; and the etch bias is lower when the feature size is small and pattern density is high. Curve 402 demonstrates that the etch bias decreases with pitch size for a pattern with short trenches. Curve 404 demonstrates the etch bias decreases with pitch size for a pattern with long trenches. Curve 406 demonstrates the etch bias decreases with pitch size for a pattern having intermediate trenches. The curves 402, 404, and 406 indicate that short trenches have smaller etch bias loading.

As semiconductor device scaling down, it is desirable to limit the etch bias loading within a high-density application area marked by 408. Because the loading effect of etch bias is less obvious for short trenches, the formed short trenches can be close to the target CD. When long trenches and short trenches are modified to avoid photoresist peeling, the short trenches may remain unchanged, and the CD design of the long trenches may be modified.

Additionally, the CD and trench depth of long trenches can be compensated using passivation-oriented etch process and/or stress tuning. As shown in the dotted lines enveloping the curves 402, 404, and 406 in FIG. 4A, applying tensile stress to a substrate being processed may reduce etch bias across pitch sizes while applying a compressive stress to a substrate being processed may increase etch bias across pitch sizes.

In some embodiments, the hard mask layer 46 may be selected to apply a proper stress to the semiconductor substrate to reduce etch bias loading. In some embodiments, the hard mask layer 46 may be selected to apply a tensile stress to the substrate, thereby, reducing etch bias. In some embodiments, the hard mask layer may be a silicon nitride layer. In some embodiments, the hard mask layer 46 may be selected to apply a tensile stress in the amount between about 0.8 GPa and about 1.2 GPa, for example about 1 GPa.

Figure 4C:
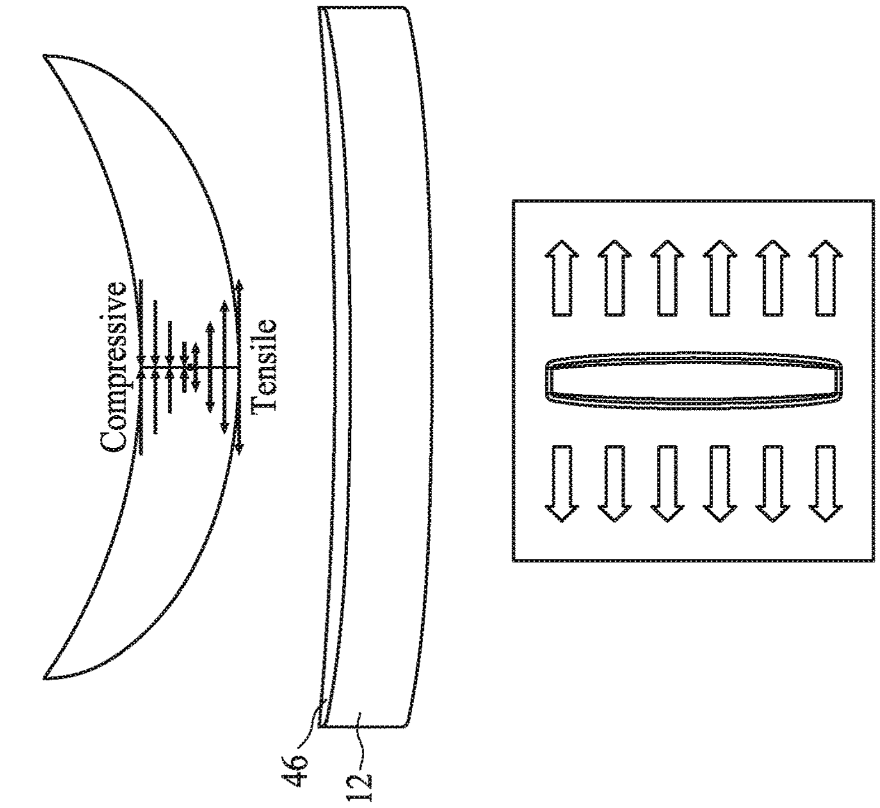
FIG. 4C schematically demonstrates adjusting etch bias by applying a tensile stress to a substrate.
Figure 4B:
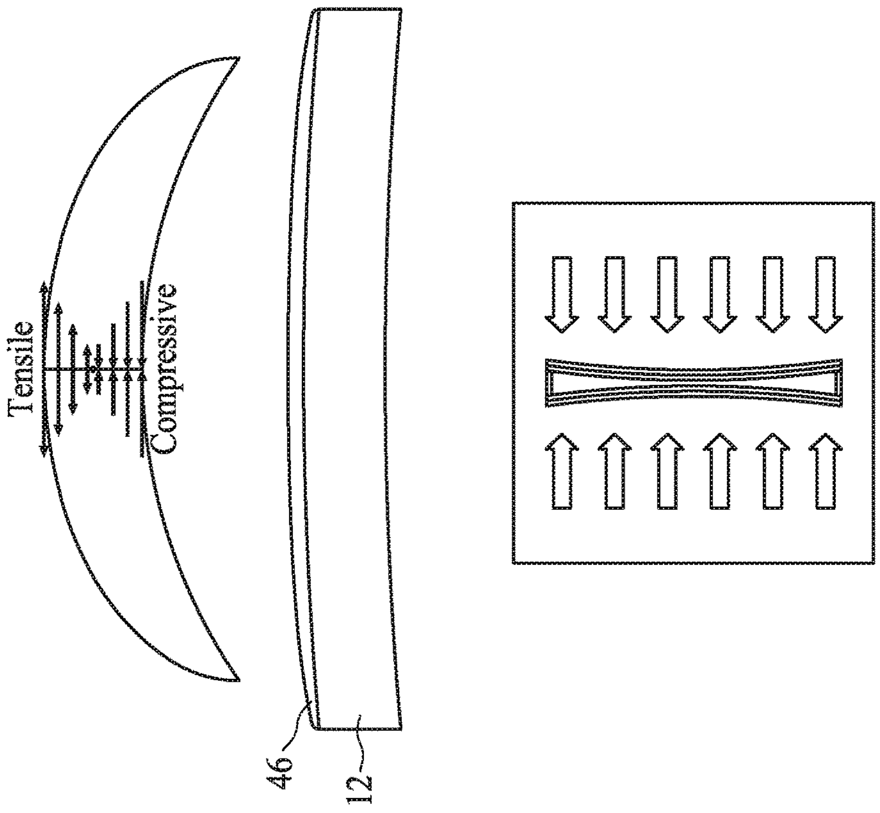
FIG. 4B schematically demonstrates adjusting etch bias by applying a compressive stress to a substrate.

FIG. 4B schematically demonstrates the effect of a hard mask layer 46 applying a compressive stress over the substrate 12. By applying a compressive stress to the substrate 12, the hard mask layer 46 shrinks the surface area of the substrate 12, resulting in an opening with reduced or compressed CD.

FIG. 4C schematically demonstrates the effect of a hard mask layer 46 applying a tensile stress over the substrate 12. By applying a tensile stress to the substrate 12, the hard mask layer 46 expands the surface area of the substrate 12, resulting in an opening with enlarged CD.

Figure 4D:
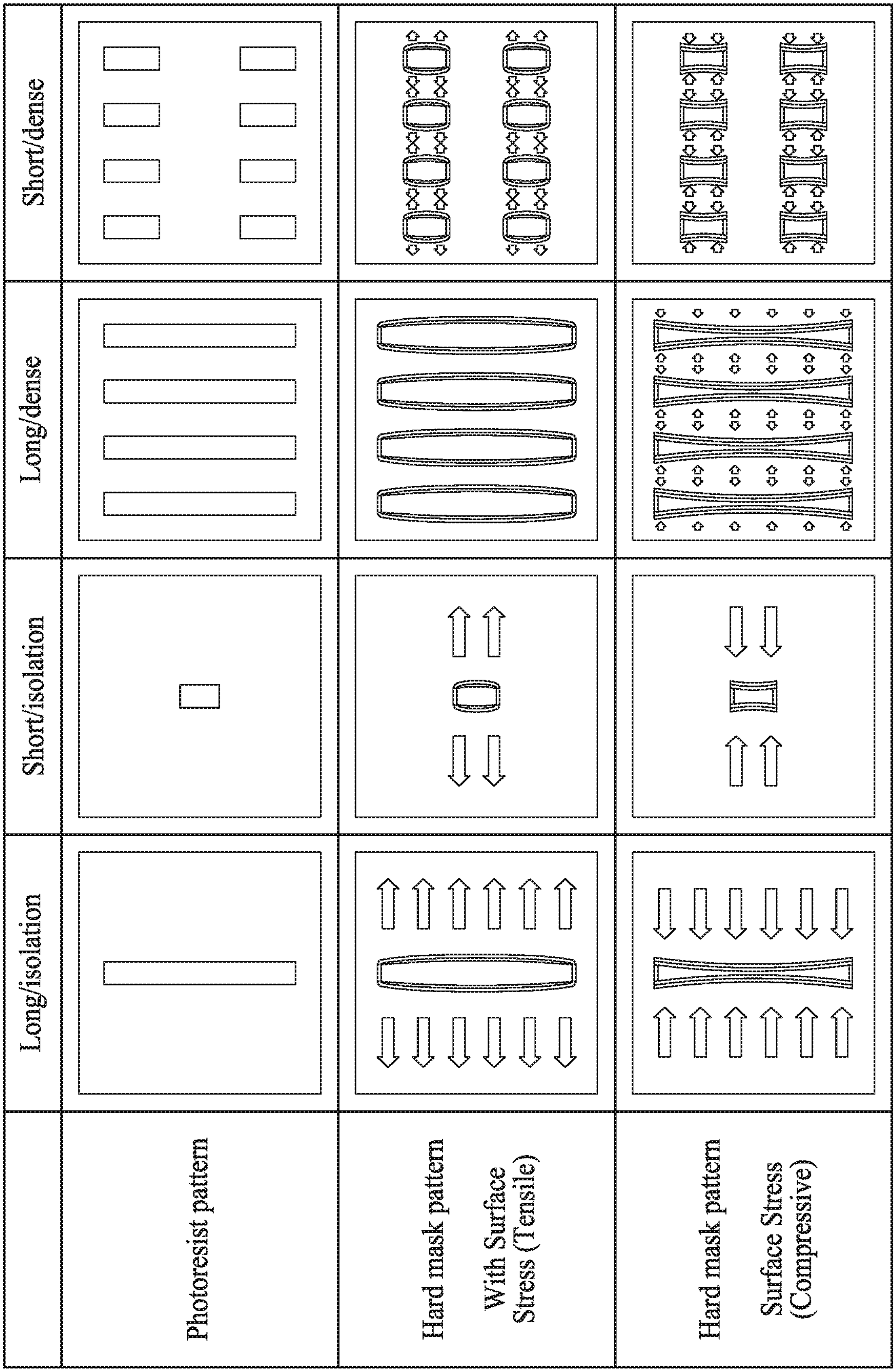
FIG. 4D schematically demonstrates adjusting etch bias using combination of stress, feature length, and pattern density.

FIG. 4D schematically demonstrates adjusting etch bias using combination of stress, feature length, and pattern density. In FIG. 4D, four patterns featured by (1) long trench and low density; (2) short trench and low density; (3) long trench and high density; and (4) short trench and high density are etched to a hard mask layer applying a tensile stress and a hard mask applying a compressive stress. The resulting patterns in the hard mask layer with various etch bias.

In some embodiments, passivation-oriented etching processes may be used to control etch rates and achieve desirable etch depth in the semiconductor substrate. A passivation-oriented etching process refers to an etching operation with an etch rate that is limited and/or largely determined by passivation effects. A passivation-oriented etching process is distinctive from and an etchant-oriented etching process, which refers to an etching operation with an etch rate that is not limited by passivation effects.

In the passivation-oriented etching operation, a large amount of polymer and by-product are generated to passivate the sidewall of the trench being etched. In some embodiments, the by-product is still active for chemical reaction and etching of the semiconductor material may proceed. In other embodiments, the by-product is noneactive for chemical reaction such that etching of the semiconductor material is stopped by the by-product.

The etching rate ER may be determined by the equation:

$$ER = \frac{1}{n} Y_{ion}\Gamma_{ion}\left(\frac{1}{1 + \frac{Y_{ion}\Gamma_{ion}}{S_{radical}\Gamma_{radical}}}\right) + \frac{1}{n} Y_{high\,energy\,ion}\Gamma_{high\,energy\,ion} - \frac{1}{n} S_{polymer}\Gamma_{polymer} \pm \frac{1}{n} S_{byproduct}\Gamma_{byproduct}$$

wherein S: sticking coefficient Y: yield Γ: flux

Further, the desorption rate of the by-product may influence the etch rate. The following table presents the boiling point (B.P.) for by-products of selected etchants at 1 atm:

TABLE 1

| Etchant | Reaction Formula | By-Product Boiling Point (B.P.) | By-Product B.P. (Kelvin) | Type of polymer formed |
|---|---|---|---|---|
| $CF_4$ | $CF_4$ + Si–> $SiF_4$ + C (polymer) | $SiF_4$ (−86° C.) | 187.15 K | CFSi based Polymer |
| $SF_6$ | $SF_6$ + Si → $SiF_4$ + SFSi (polymer) | $SiF_4$ (−86° C.) | 187.15 K | SFSi based polymer |
| $Cl_2$ | $Cl_2$ + p-Si → $SiCl_x$ | $SiCl_4$ (57.65° C.) | 330.8 K | |
| $BCl_2$ | $BCl_3$ + p-Si → $SiB_x$ + $SiCl_x$ | $SiCl_4$ (57.65° C.) | 330.8 K | $SiB_x$ based polymer |
| HBr | HBr + Si → $SiBr_4$ + H | $SiBr_4$ (153° C.) | 426.15 K | SiBr based polymer |

As shown in Table 1, the by-product desorption rate of $SiF_4$ is greater than the by-product desorption rate of $SiCl_4$, which is greater than the by-product desorption rate of $SiBr_4$. Therefore, HBr based etch operations lead to severe by-product accumulation, resulting passivation-oriented processes. On the other hand, CI/F based etch operations lead to fast removal of by-products via desorption, resulting in etchant-oriented processes. It is noted that the pressure in the etch chamber may be much lower than 1 atm; however, it is expected that the trend of by-product desorption rate will remain the same.

Figure 5A:
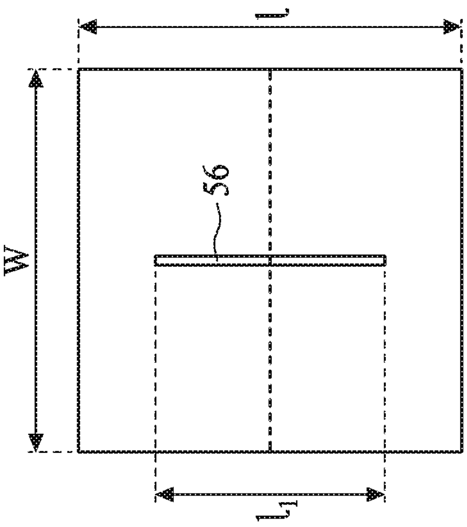
FIGS. 5A-5D schematically illustrate a passivation-oriented etching operation in forming trenches of the isolated structures according to embodiments of the present disclosure.
Figure 5B:
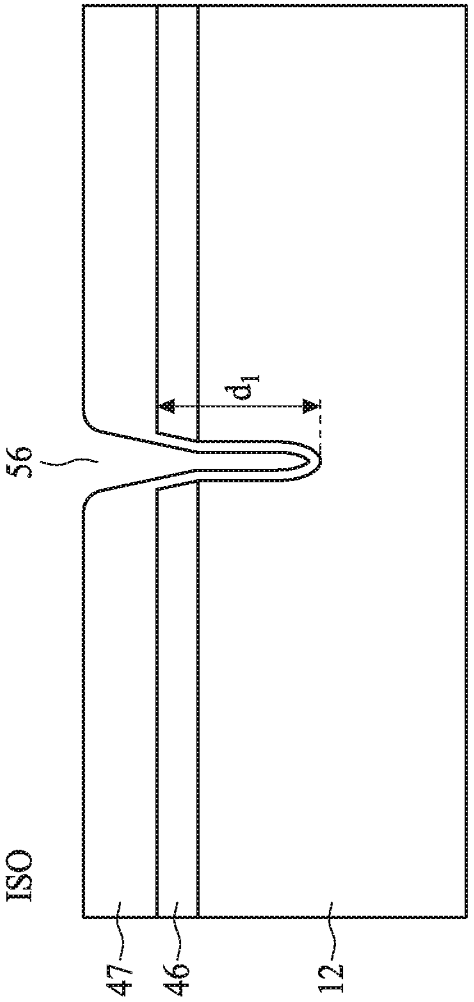

FIGS. 5A-5D schematically illustrate a passivation-oriented etching operation in forming trenches 56 of the isolated structures 20. FIGS. 5A-5B schematically illustrate an isolated trench 56. As shown in FIG. 5B, the passivation-oriented etching operation etches trench 56 to a vertical depth $d_1$. The passivation-oriented etching operation forms a by-product 47 on the hard mask layer 46 and on sidewalls of the trench 56. For example, the by-product 47 may be a polymer film.

For the passivation-oriented etching operation in the isolated trench 56, the total reactive area $A_1$ is equal to the width w×times the length l plus twice the depth $d_1$ times length $l_1$:

$$A_1 \approx (w \times l) + 2(d_1 \times l_1)$$

It has been found that, in isolated pattern, such as the isolated trench 56 in FIGS. 5A-5B, passivation-oriented etching operations form trench 56 having relatively shallow vertical etch depths $d_1$.

Figure 5C:
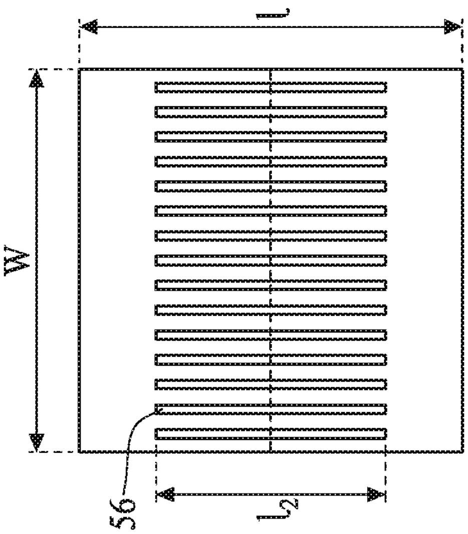
Figure 5D:
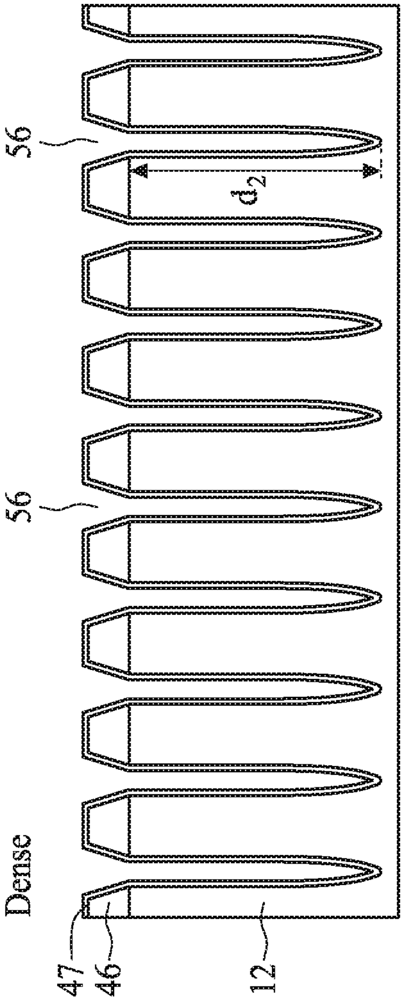

FIGS. 5C and 5D illustrate an etchant-oriented etching operation in forming densely arranged trenches 56. As shown in FIG. 5D, the etchant-oriented etching operation etches densely arranged trenches 56 to a vertical depth $d_2$. The passivation-oriented etching operation forms a by-product 47 on the hard mask layer 46 and on sidewalls of the densely arranged trenches 56.

For the passivation-oriented etching operation in the dense region 1002, the total reactive area $A_2$ is equal to the width w times the length l plus n times twice the depth $d_2$ times length $l_2$, where n is the number of fin structures in the dense region:

$$A_2 \approx (w \times l) + n \times 2(d_2 \times l_2)$$

It has been found that, in a dense pattern, such as the isolated trenches 56 in FIGS. 5C-5D, etchant-oriented etching operations form trenches having relatively deep vertical etch depths $d_2$.

Figure 6:
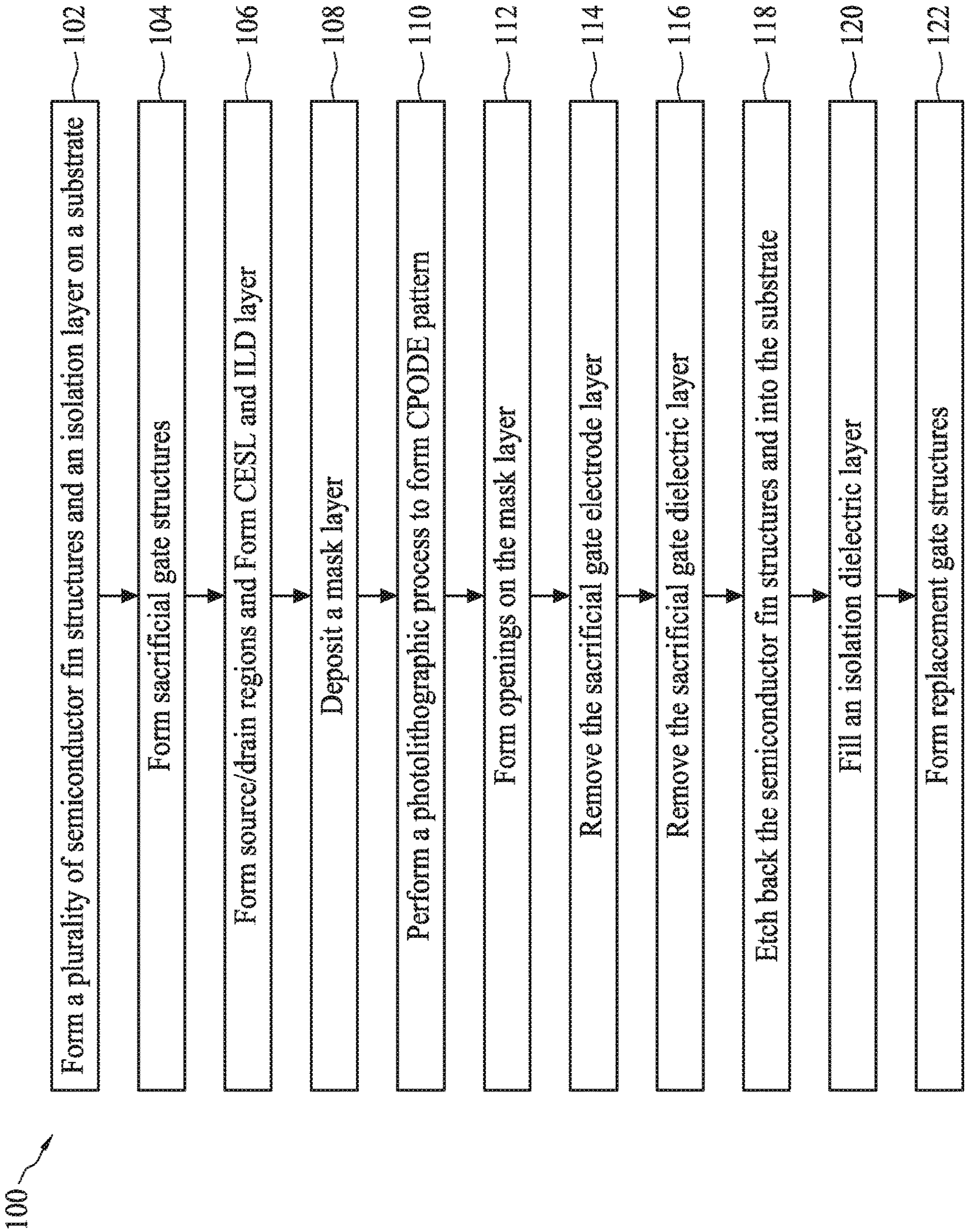
FIG. 6 is a flow chart of a method for manufacturing of a semiconductor substrate according to embodiments of the present disclosure.

FIG. 6 is a flow chart of a method 100 for manufacturing of a semiconductor device according to embodiments of the present disclosure. FIGS. 7A-7B and 13A-13B schematically illustrate various stages of manufacturing a semiconductor device 300 according to embodiments of the present disclosure. The semiconductor device 300 may include isolation structures similar to the semiconductor devices 10, 10*a*, 10*b*, 10*c*, and 10*d*.

Figure 7A:
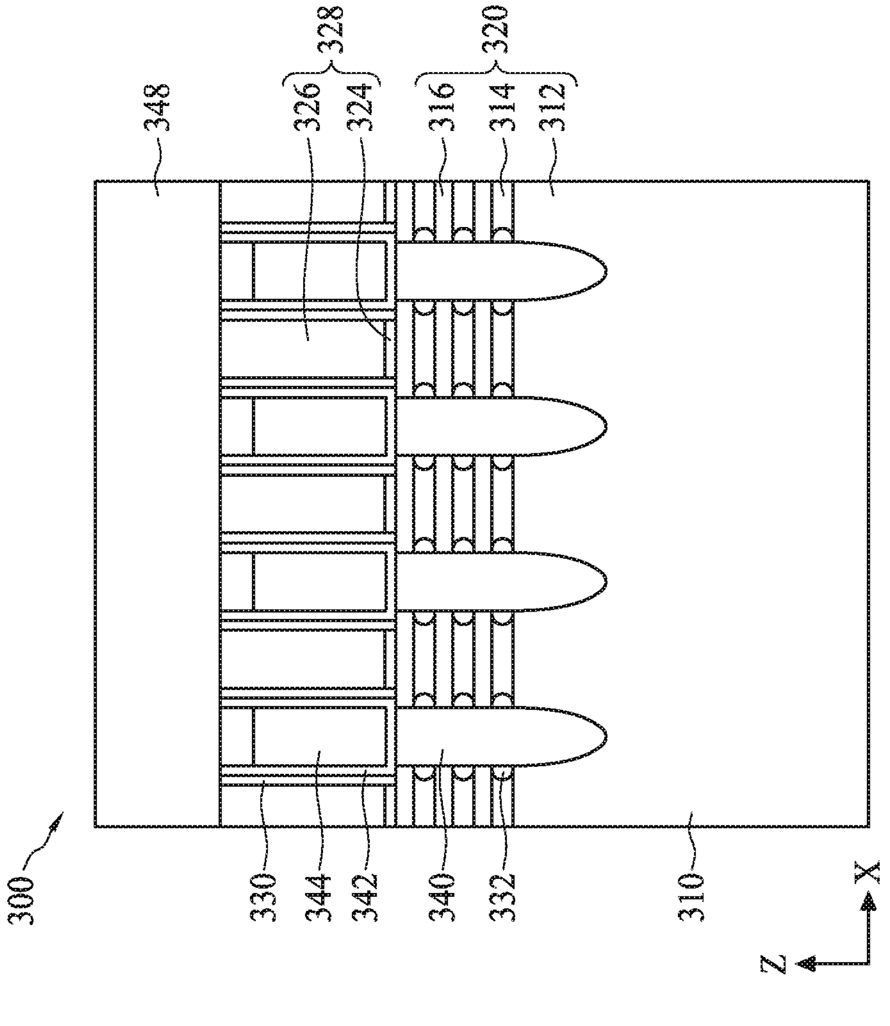
FIGS. 7A-7B, 8A-8B, 9A-9B, 10A-10B, 11A-11B, 12A-12B, and 13A-13B schematically illustrate various stages of manufacturing a semiconductor device according to embodiments of the present disclosure.
Figure 7B:
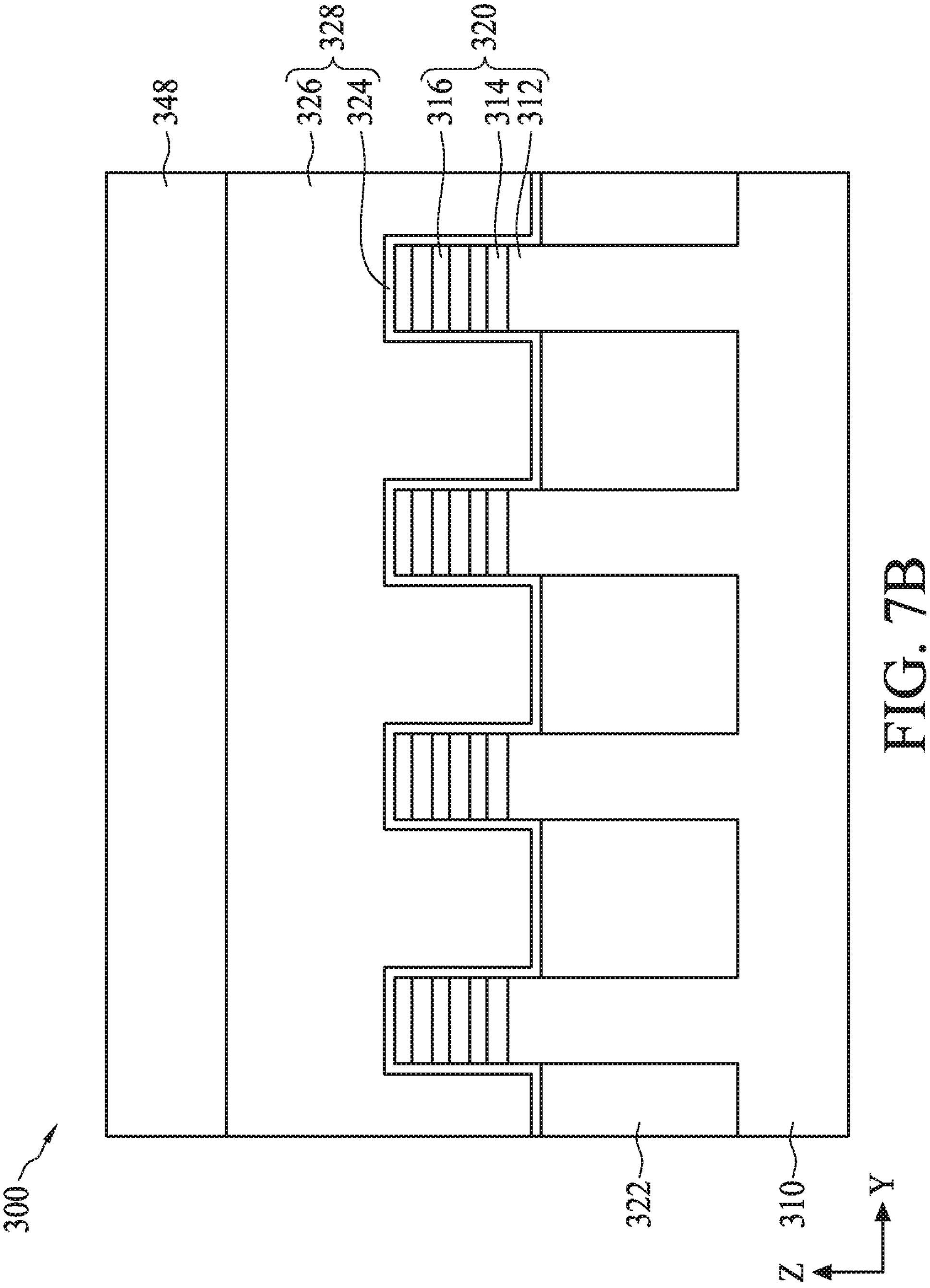

The method 100 begins at operation 102 where a plurality of semiconductor fins 320 are formed over a substrate 310, as shown in FIGS. 7A-7B. FIG. 7A is a cross-sectional view of the semiconductor device 300 along the x-direction. FIG. 7B is a schematic cross-sectional view of the semiconductor device 300 along the y-direction.

The substrate 310 may include a single crystalline semiconductor material such as, but not limited to Si, Ge, SiGe, GaAs, InSb, GaP, GaSb, InAlAs, InGaAs, GaSbP, GaAsSb, and InP. The substrate 310 may include various doping configurations depending on circuit design. For example, different doping profiles, e.g., n-wells, p-wells, may be formed in the substrate 310 in regions designed for different device types, such as n-type field effect transistors (NFET), and p-type field effect transistors (PFET). In some embodiments, the substrate 310 may be a silicon-on-insulator (SOI) substrate including an insulator structure for enhancement.

Semiconductor fins 320 are formed on and in the substrate 310. The semiconductor fins 320 may be formed by patterning a hard mask deposited on the semiconductor stack and one or more etching processes. The semiconductor fins 320 are formed along the x-direction. Each of the semiconductor fins 320 includes a well portion 312 formed from the semiconductor substrate 310 and a semiconductor stack including alternatively stacked sacrificial semiconductor layers 314 and semiconductor channel layers 316.

An isolation layer 322 is then formed in the trenches between the semiconductor fins 320. The isolation layer 322 may be formed by a high-density plasma chemical vapor deposition (HDP-CVD), a flowable CVD (FCVD), or other suitable deposition process. In some embodiments, the isolation layer 322 may include silicon oxide, silicon nitride, silicon oxynitride, fluorine-doped silicate glass (FSG), a low-k dielectric, combinations thereof. In some embodiments, the isolation layer is formed to cover the semiconductor fins 320 by a suitable deposition process, such as atomic layer deposition (ALD), and then recess etched using a suitable anisotropic etching process to expose the channel portions 318 of the semiconductor fins 320.

In some embodiments, dielectric fins (not shown) may be formed between the semiconductor fins 320. The dielectric fins may be formed during deposition and etching back of the isolation layer 322.

In operation 104, sacrificial gate structures 328 and spacer layers 330 are then formed over the semiconductor fins 320, as shown in FIGS. 7A-7B. A sacrificial gate dielectric layer 324 is deposited over the exposed surfaces of the semiconductor device 300. The sacrificial gate dielectric layer 324 may be formed conformally over the semiconductor fins 320, and the isolation layer 322. In some embodiments, the sacrificial gate dielectric layer 324 may be deposited by a CVD process, a sub-atmospheric CVD (SACVD) process, a FCVD process, an ALD process, a PVD process, or other suitable process. The sacrificial gate dielectric layer 324 may include one or more layers of dielectric material, such as $SiO_2$, SiN, a high-K dielectric material, and/or other suitable dielectric material.

A sacrificial gate electrode layer 326 is deposited over the sacrificial gate dielectric layer 324. The sacrificial gate electrode layer 326 may be blanket deposited on the over the sacrificial gate dielectric layer 324. The sacrificial gate electrode layer 326 includes silicon such as polycrystalline silicon or amorphous silicon. In some embodiments, the sacrificial gate electrode layer 326 is subjected to a planarization operation. The sacrificial gate electrode layer 326 may be deposited using CVD, including LPCVD and PECVD, PVD, ALD, or other suitable process. A patterning operation is the performed over the sacrificial gate dielectric layer 324 layer and the sacrificial gate electrode layer 326 to form the sacrificial gate structures 328, which cover formed over portions of the semiconductor fins 320 designed to be channel regions.

Gate sidewall spacers 330 are then formed on sidewalls of each sacrificial gate structures 328. After the sacrificial gate structures 328 are formed, the gate sidewall spacers 330 may be formed by a blanket deposition of an insulating material followed by anisotropic etch to remove insulating material from horizontal surfaces. The gate sidewall spacers 330 may have a thickness in a range between about 3 nm and about 8 nm. In some embodiments, the insulating material of the gate sidewall spacers 330 is a silicon nitride-based material, such as SiN, SiON, SiOCN or SiCN and combinations thereof. In FIG. 7A, the gate sidewall spacers 330 include two layers. In other embodiments, the gate sidewall spacers 330 may be formed from less or more layers of dielectric materials.

The semiconductor fins 320 are etched back forming source/drain recesses. End portions of the semiconductor layers 314 are selectively removed and inner spacers 332 are formed therein.

In operation 106, source/drain regions 340 are formed by an epitaxial growth method using CVD, ALD or molecular beam epitaxy (MBE), as shown in FIGS. 7A-7B. The source/drain regions 340 may include one or more layers of Si, SiP, SiC and SiCP for NFET or Si, SiGe, Ge for a PFET. For the PFET, p-type dopants, such as boron (B), may also be included in the source/drain regions 340.

A contact etch stop layer (CESL) 342 and an interlayer dielectric (ILD) layer 344 are formed over the exposed surfaces. The CESL 342 is formed on the epitaxial source/drain regions 340 and the gate sidewall spacers 330. The CESL 342 may include $Si_3N_4$, SiON, SiCN or any other suitable material, and may be formed by CVD, PVD, or ALD. The interlayer dielectric (ILD) layer 344 is formed over the contract etch stop layer (CESL) 342. The materials for the ILD layer 344 include compounds comprising Si, O, C, and/or H, such as silicon oxide, SiCOH and SiOC. Organic materials, such as polymers, may be used for the ILD layer 344. After the ILD layer 344 is formed, a planarization operation, such as CMP, is performed to expose the sacrificial gate electrode layer 326 for subsequent removal of the sacrificial gate structures 328. The ILD layer 344 protects the epitaxial source/drain regions 340 during the removal of the sacrificial gate structures 328.

In operation 108, a mask layer 348 is deposited on the semiconductor device 300, as shown in FIGS. 7A-7B. The mask layer 348 may include in one or more dielectric layer. The mask layer 348 may be deposited over the sacrificial gate structure 328, the gate spacers 330, the CESL 342, and ILD layer 344. In some examples, the one or more mask layers may include or be silicon nitride, silicon oxynitride, silicon carbide, silicon carbon nitride, the like, or a combination thereof, and may be deposited by CVD, PVD, ALD, or another deposition technique. In some embodiments, composition and thickness of the mask layer 348 may be selected to apply a tensile stress to the substrate 312, similar to the hard mask layer 46 in FIG. 4C. By applying a tensile stress to the substrate 312, etch bias loading in the subsequent etching process may be reduced. In some embodiments, the mask layer 348 may be a silicon nitride having a thickness in a range between about 650 angstroms and 850 angstroms, for example between about 730 angstroms and about 750 angstroms.

Figure 8A:
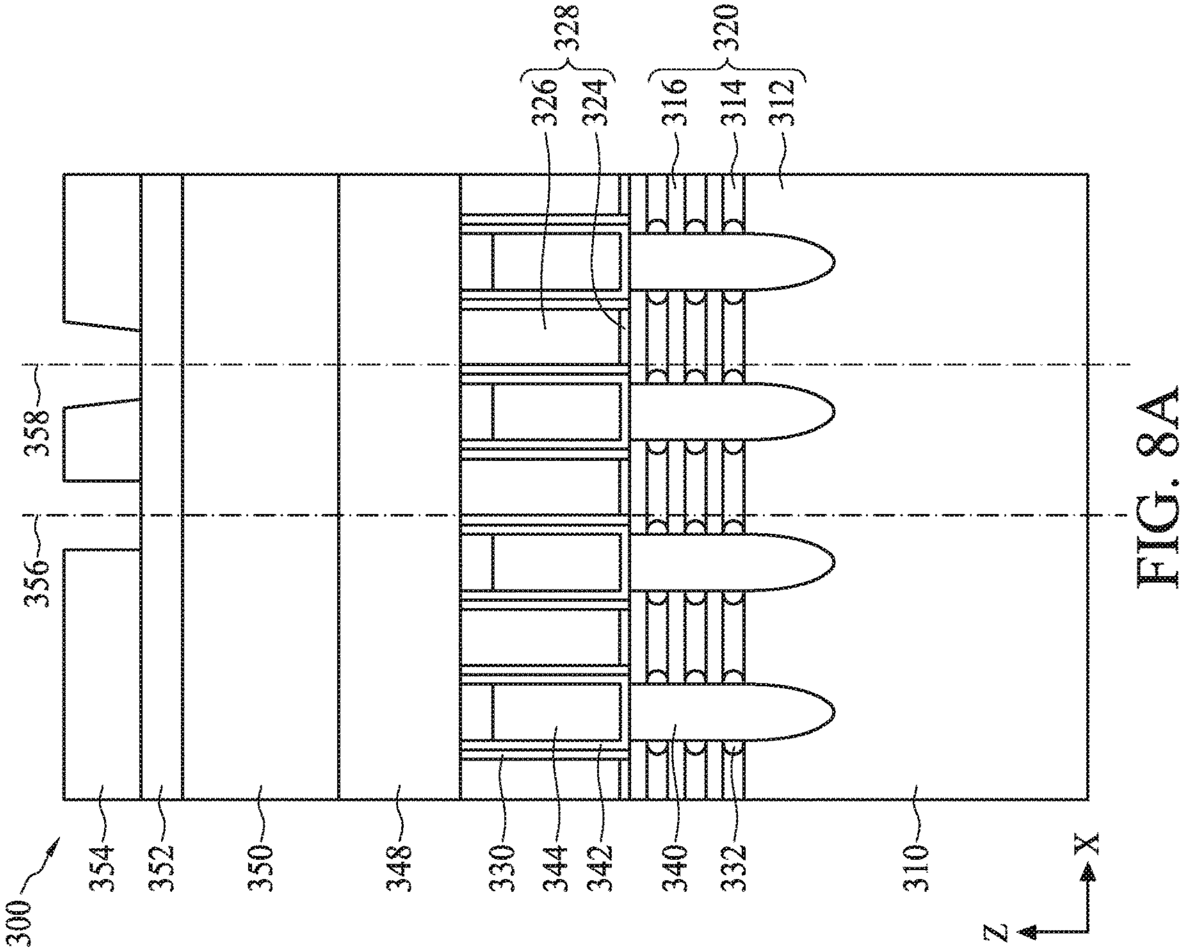
Figure 8B:
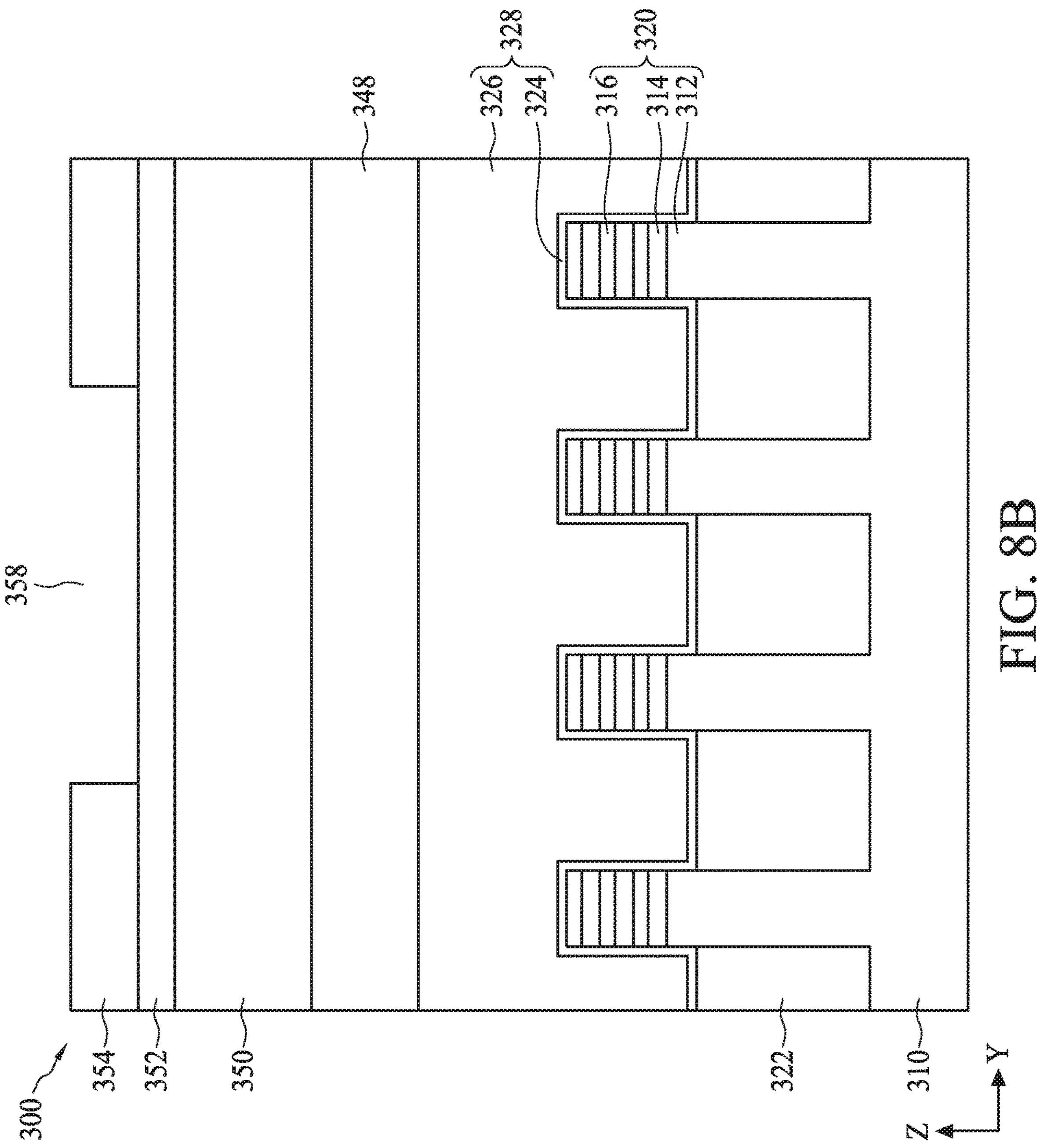

In operation 110, a photolithographic process is performed to form a CPODE pattern in a photoresist layer, as shown in FIGS. 8A-8B. In some embodiments, a tri-layer photoresist stack including a bottom layer 350, a back anti-reflection coating (BARC) 352, and a photo resist (PR) layer 354 are deposited. A lithographic process is performed to form a CPODE pattern.

In some embodiments, the CPODE pattern may include a long opening 356 and a short opening 358 in alignment with the sacrificial gate structures 328. The long opening 356 and the short opening 358 are aligned with two neighboring sacrificial gate structures 328. The short opening 358 is shaped to form a short segment of the isolation structure 20 discussed above. The long opening 356 may include a narrow segment and two wide segments. The narrow segment of the long opening 356 overlaps with the short opening 358.

The long openings 356 and the short openings 356 may be arranged in a pattern to achieve isolation across semiconductor fins 320. The long opening 356 and the short opening 358 may form pa pattern similar to the isolation patterns described in the semiconductor device 10, 10*a*, 10*b*, 10*c*, and 10*d*.

As shown in FIG. 8A, the long opening 356 and the short opening 358 are positioned along two neighboring sacrificial structures 328. By positing the long opening 356 is positioned next to the short opening 356, a spacing between the openings 356, 358 may be maintained at a dimension to avoid photoresist defects, such as peeling.

Figure 9A:
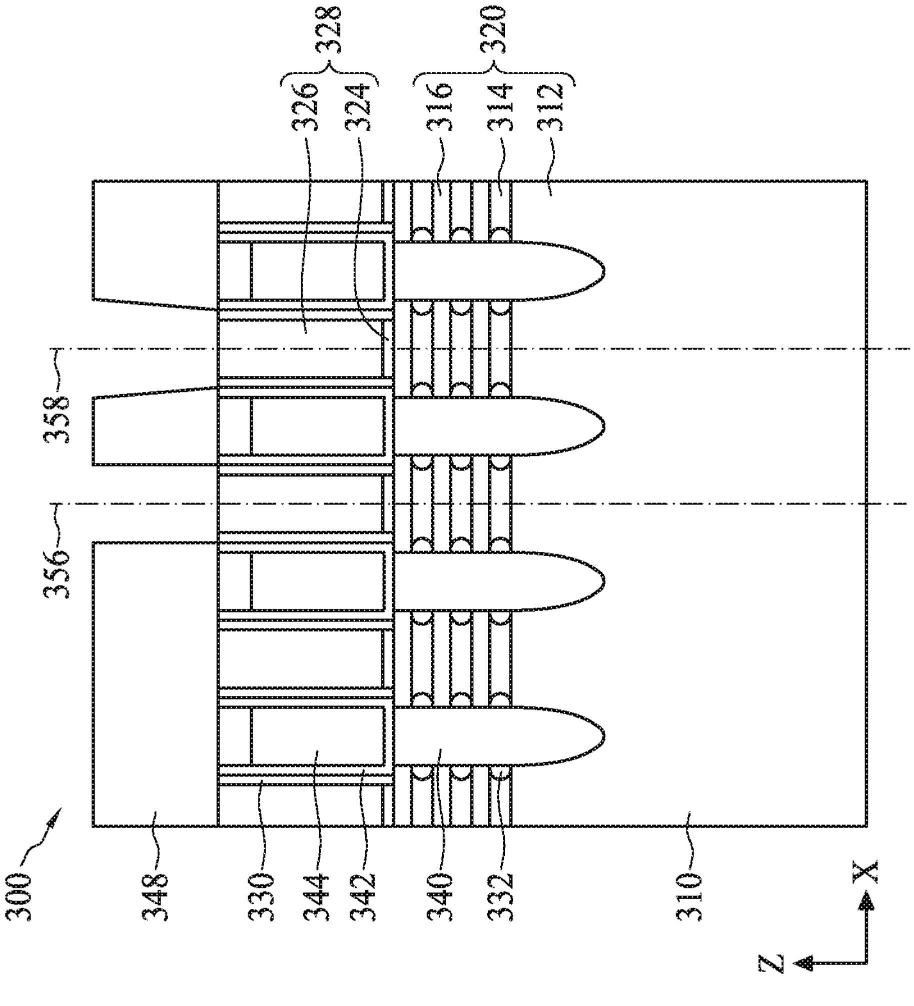
Figure 9B:
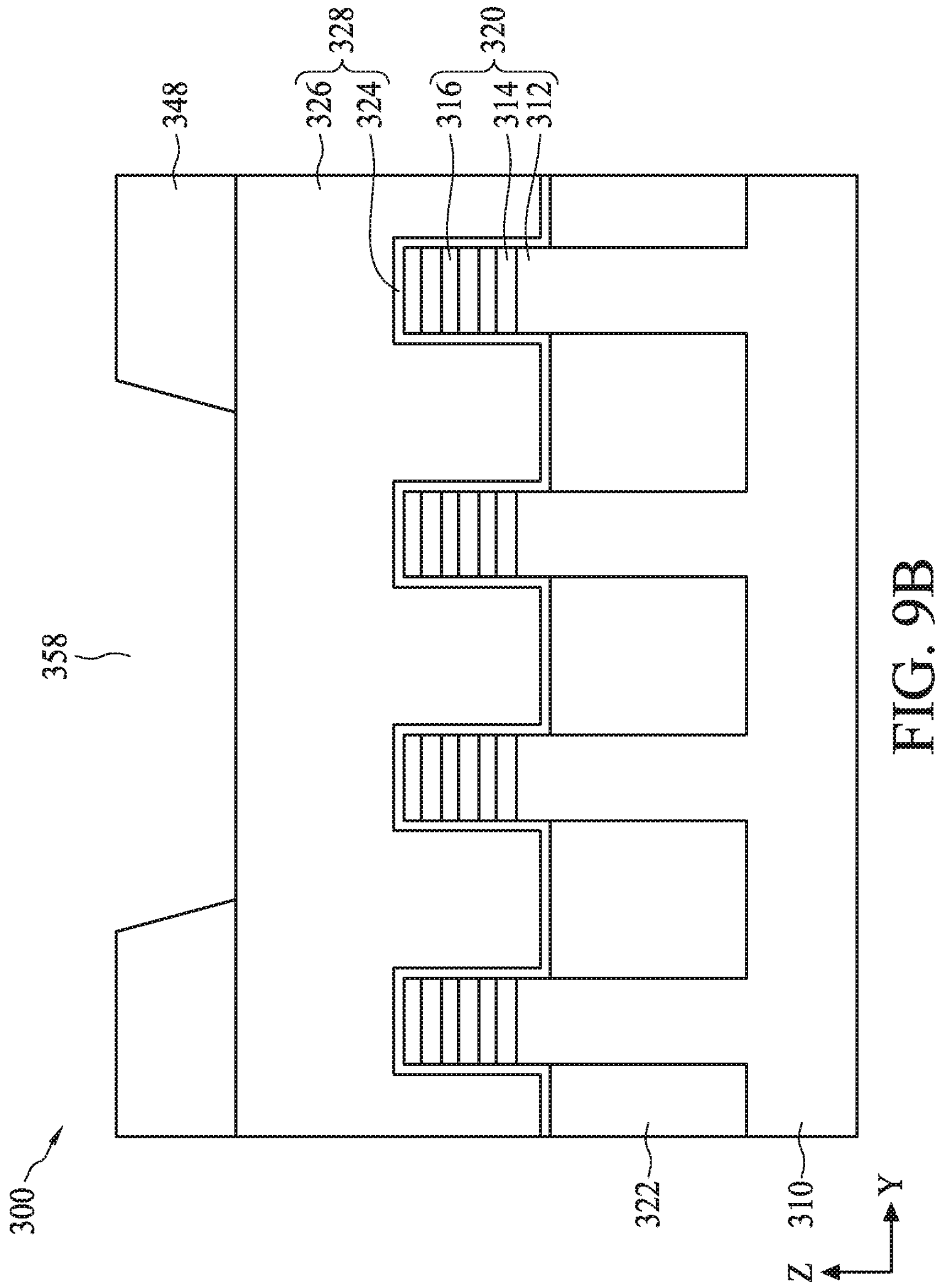

In operation 112, the CPODE pattern is transferred to the mask layer 348, as shown in FIGS. 9A-9B. In some embodiments, the CPODE pattern may be transferred to the mask layer 348 by a suitable etch process. As discussed above, the combination of the short and long trench design and the tensile stress applied by the hard mask layer 246, the etch bias loading is reduced. After operation 112, portions of the sacrificial gate structures 328 are exposed. The long opening 356 in the mask layer 348 may be wider than the sacrificial gate electrode layer 326 along the x-direction while the short opening 356 in the mask layer 348 may expose a portion of the sacrificial gate electrode layer 326.

Figure 10A:
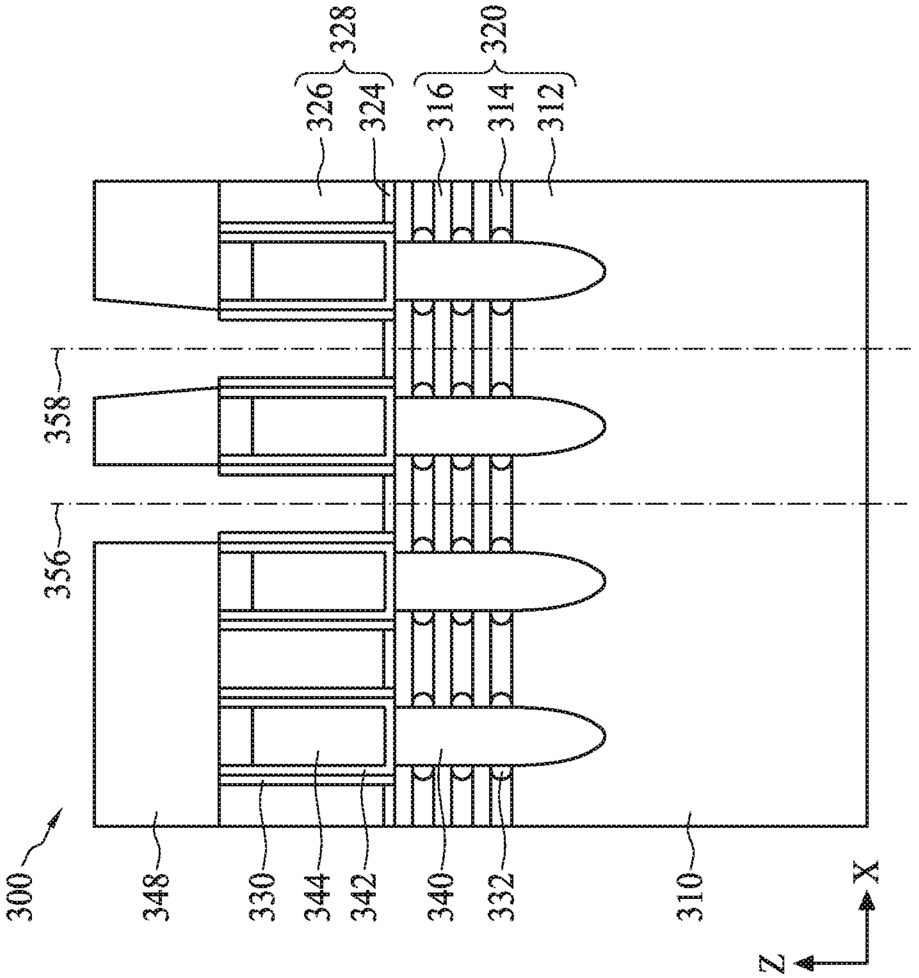
Figure 10B:
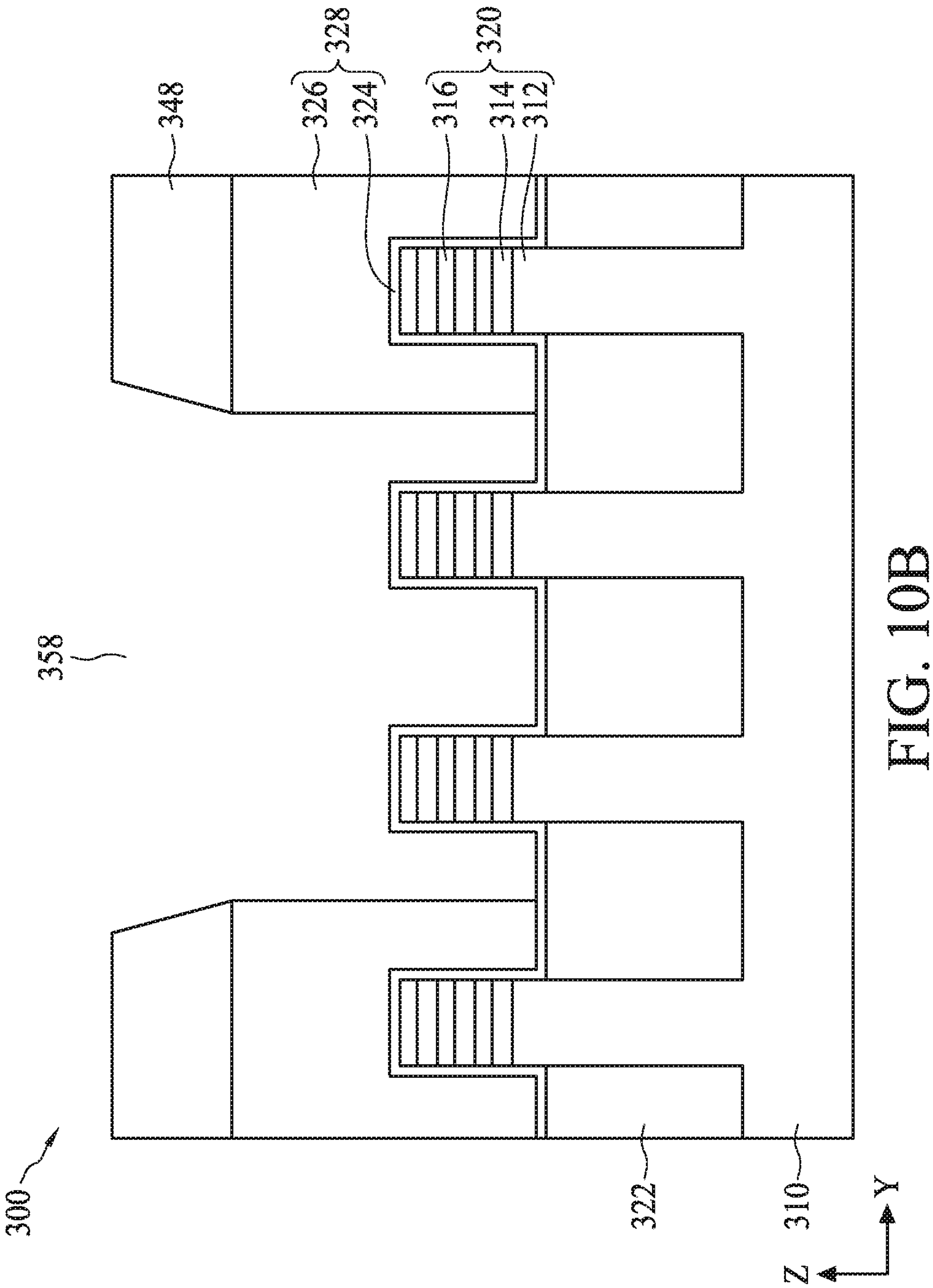

In operation 114, an etch process is performed to selectively remove the sacrificial gate electrode layer 326, as shown in FIGS. 10A-10B. In some embodiments, when the sacrificial gate electrode layer 326 is polysilicon, a wet etchant such as a Tetramethylammonium hydroxide (TMAH) solution can be used to selectively remove the sacrificial gate electrode layer 326 without removing the dielectric materials of the ILD layer 342, the CESL 344, and the sidewall spacers 330. As shown in FIG. 10A, under the long opening 356 and short opening 358 in the mask layer 348, the gate sacrificial gate electrode layer 326 may be substantially removed exposing the gate spacers 330.

Figure 11A:
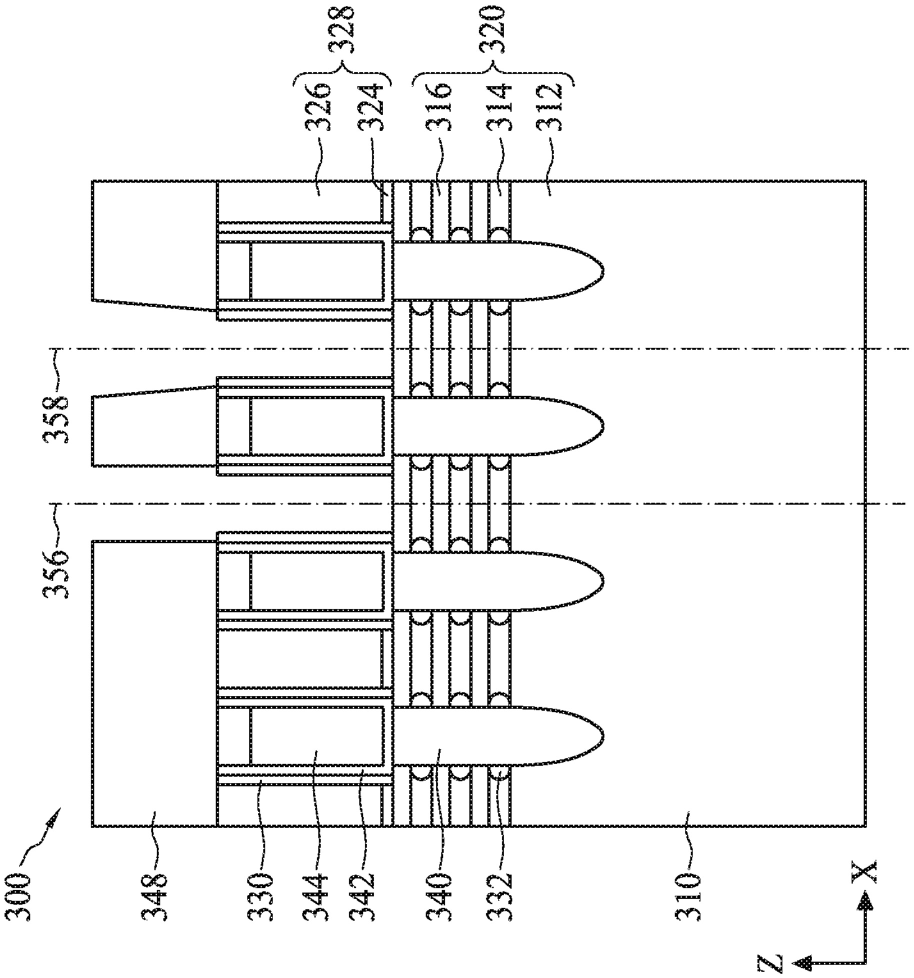
Figure 11B:
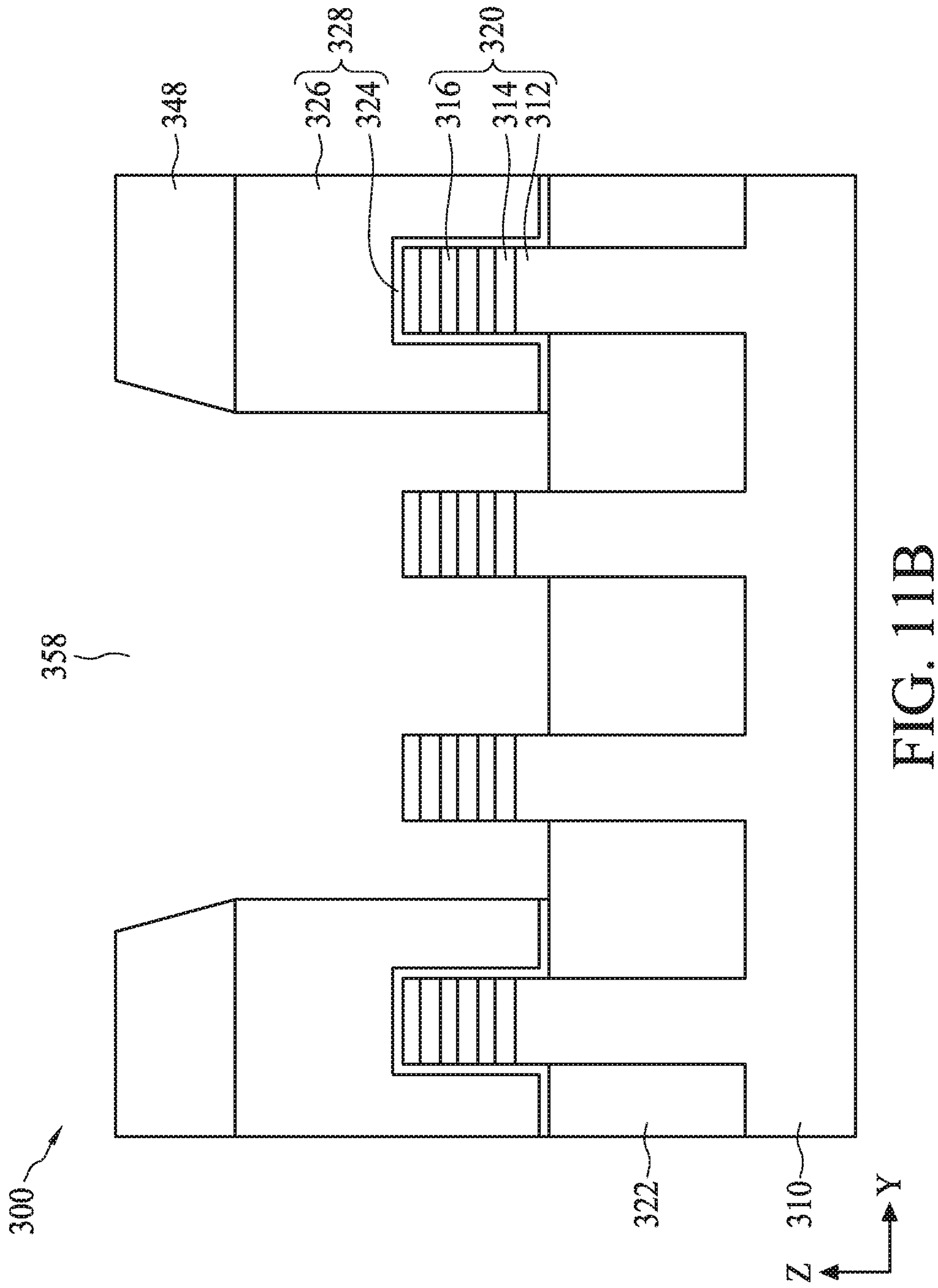

In operation 116, an etch process is performed to remove the sacrificial gate dielectric layer 324, as shown in FIGS. 11A-11B. The sacrificial gate dielectric layer 324 may be removed by any suitable etching process, such as plasma dry etching and/or wet etching. After operation 116, the semiconductor fins 320 exposed through the openings 356, 358 are exposed.

Figure 12A:
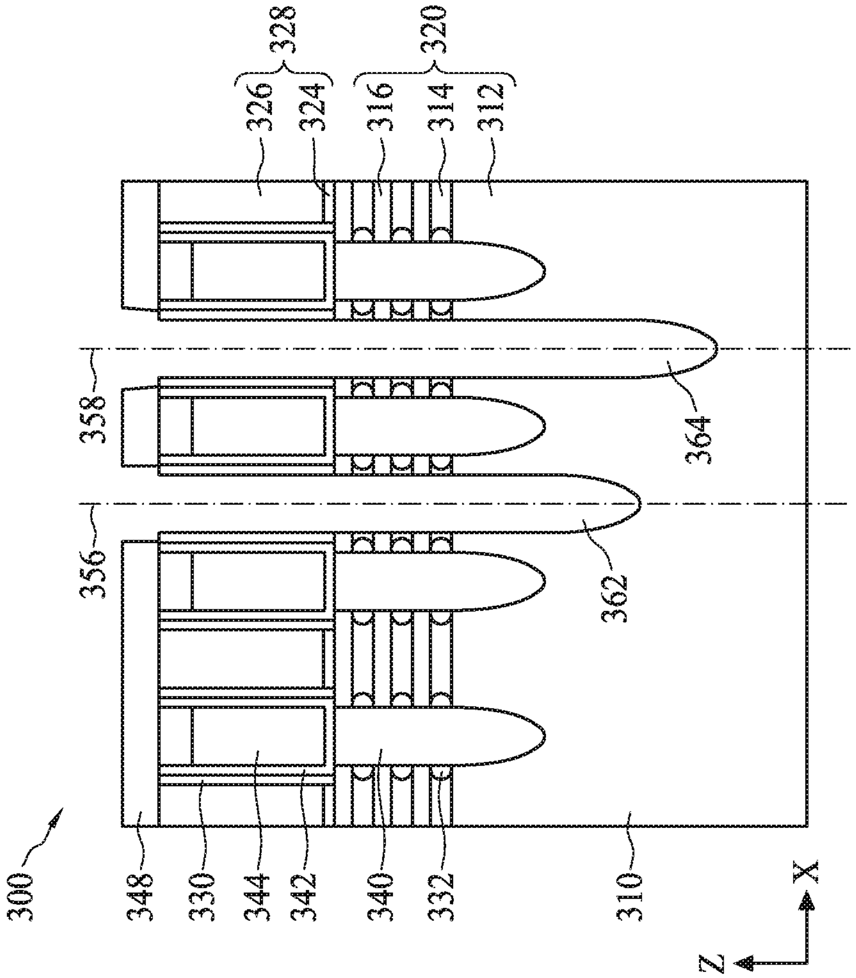
Figure 12B:
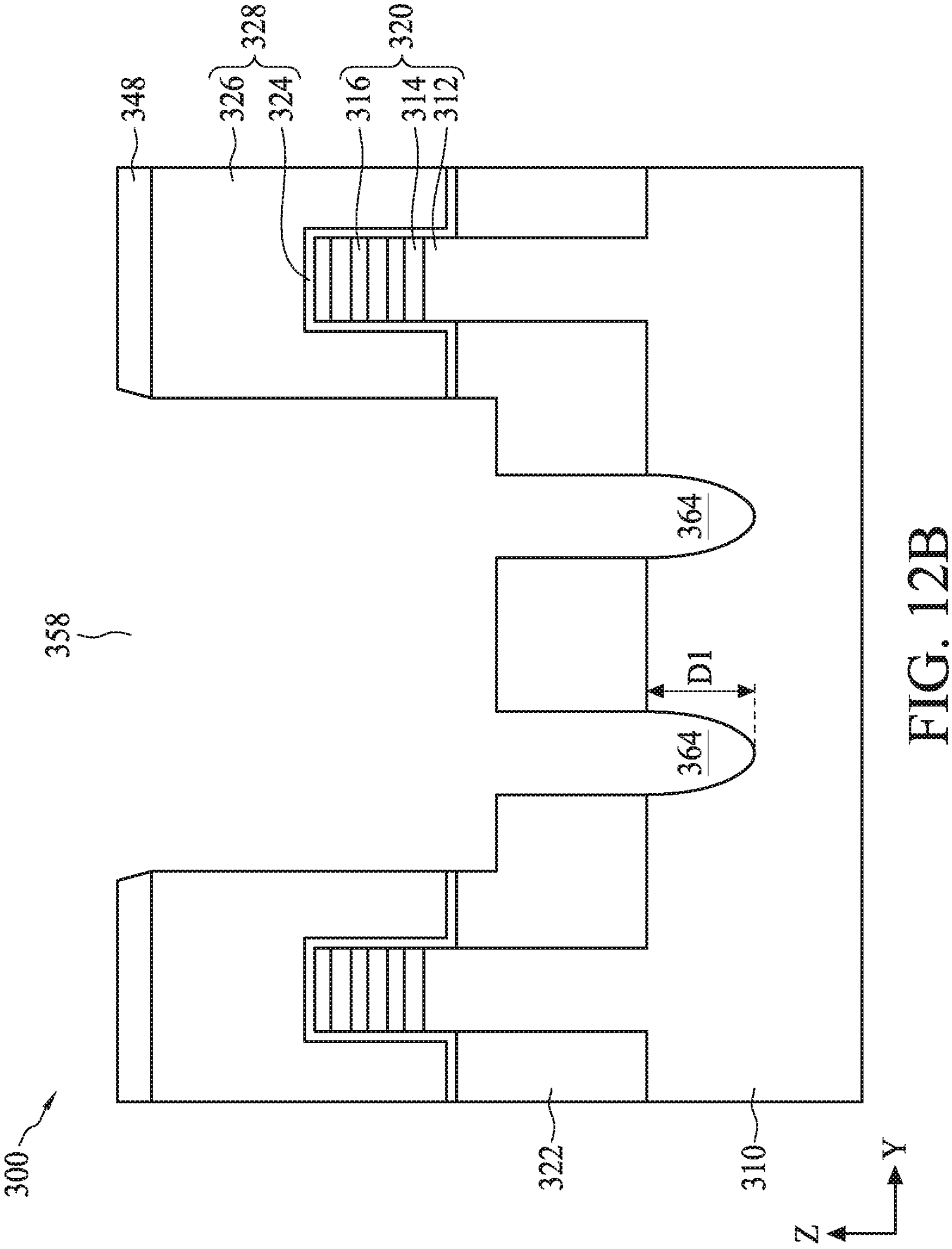

In operation 118, an etch process is performed to remove the semiconductor fin 320 and into the semiconductor substrate 310 and form isolation openings 362, 364, as shown in FIGS. 12A-12B. The etch process may include one or more plasma etch operations configured to selectively remove semiconductor materials to form self-aligned CPODE openings in the semiconductor substrate 310. In some embodiments, the self-aligned etch process may be performed by one or more plasma etching.

In some embodiments, a passivation-oriented etch operation is performed to remove the semiconductor materials through the openings 356, 358. In some embodiments, the passivation-oriented etch process can be achieved through HBr based plasma etch. In some embodiments, $O_2$ or $CO_2$ may be added to HBr. In some embodiments, a polymer protection layer may be deposited on top of the hard mask layer 348 in the beginning of the etch process to increase the etch selectivity of semiconductor material, such as silicon, over materials in hard mask layer 348, such as SiN. Additionally, passivation layer may be formed during the etch processes to facilitate the self-aligned etch process. In some embodiments, the passivation layer may be silicon oxide based. In some embodiments, the passivation process may be formed using precursors containing $SiCl_4$, $O_2$, and HBr. In some embodiments, a break-through operation may be performed to remove excessive passivation layers. In some embodiments, the break-through operation may be an etch process based on a fluorine containing etchant, such as $CF_4$, $CHF_3$, $CH_2F_2$, $CHF_3$, $C_4F_6$, or a combination thereof.

In some embodiments, the plasma etch process may be high density plasma process. The etch process may be performed using processing chambers with an ICP (inductive coupled plasma) or resonant antenna plasma source. The plasma may be driven by an RF power generator using AC electrical current operating on a frequency of multiple of 13.56 MHz and 27 MHz. The process chamber may be operated at a pressure in a range of about 1 mTorr to about 200 mTorr. The etch process may be performed at a temperature range between about 10 degrees Celsius to about 200 degrees Celsius. The RF power generator may be operated at a power level between about 0 W to about 2500 W. In some embodiments, an RF bias power may be applied to a substrate pedestal in the process chamber. The RF bias power may be in a range of about 0 W to about 2000 W. In some etching operation, the etch plasma may be pulsed with a duty cycle in a range of about 5% to 95%. In some embodiments, the plasma operation may be performed with only bias power, i.e., with zero plasma power, to enhance etch directionality.

After operation 118, the isolation openings 362, 364 are formed through the long opening 356 and short opening 358 in the mask layer 348 respectively. In some embodiments, the isolation opening 364 extends into the semiconductor substrate 310 deeper than a segment of the isolation opening 264 corresponding to the narrow segment of the long opening 256 overlapping with the short opening 358. The opening 264 may have a depth D1 below the isolation layer 322 along the z-direction. The opening 362 may have a depth D2 below the isolation layer 322 along the z-direction. The depth D1 is greater than the depth D2.

Figure 13A:
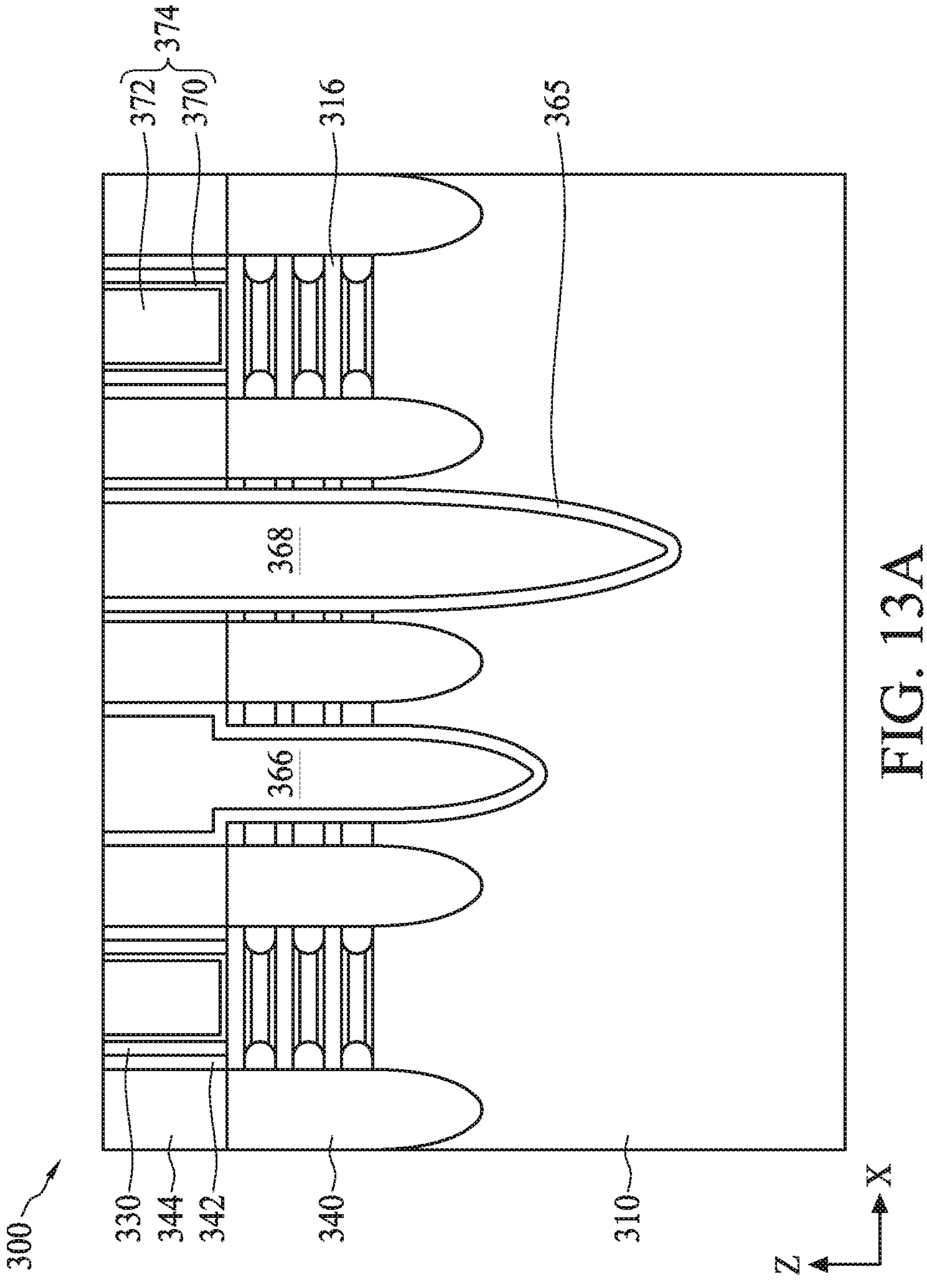
Figure 13B:
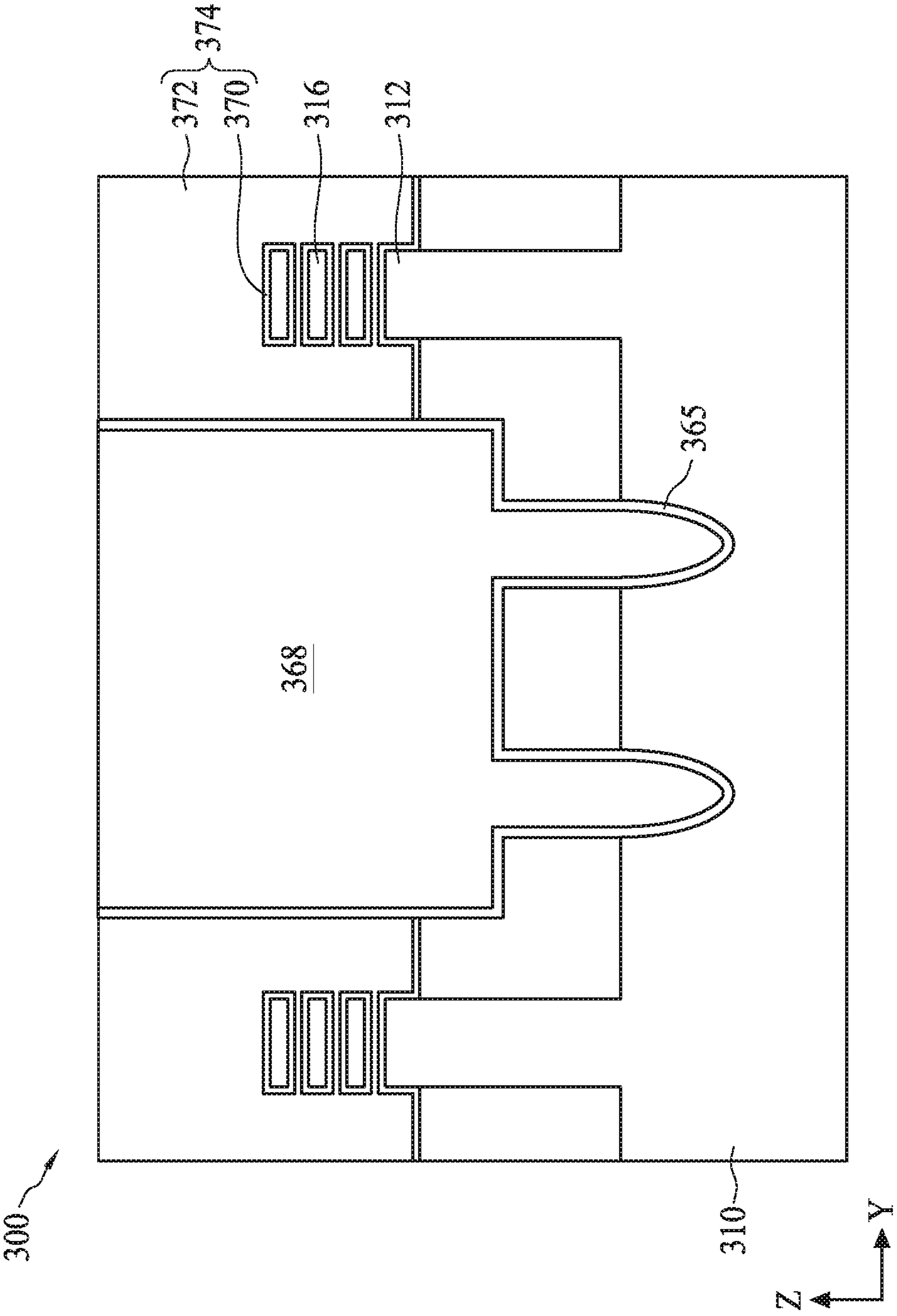

In operation 120, the openings 362 and 364 are filled with isolation material to form isolation structures 366, 368, as shown in FIGS. 13A-13B. In some embodiments, a fill material is deposited in the openings 362, 264 in place of the removed semiconductor substrate 310, the semiconductor fins 320, and the section of the sacrificial gate structure 3. The fill material may be an insulating material. In some examples, the fill material may be a single insulating material, and in other examples, the fill material may include multiple different insulating materials, such as in a multilayered configuration. The fill material may include or be silicon oxide, silicon nitride, silicon oxynitride, silicon carbide, silicon carbon nitride, the like, or a combination thereof, and may be deposited by CVD, PVD, ALD, or another deposition technique. In some embodiments, a liner layer 365 may be formed prior to depositing the fill material. After depositing the liner layer 365 and the fill material, a CMP process may be performed to expose the sacrificial gate structures 328 for subsequent processes.

The isolation structure 368 extends sufficiently deep into the semiconductor substrate 310 and provides electrical isolation between the source/drain regions 340 at opposing sides.

In operation 122, replacement gate process is performed as shown in FIGS. 13A-13B. The sacrificial gate structures 328 are first removed. Particularly, the sacrificial gate electrode layer 326 and the sacrificial gate dielectric layer 324 are removed sequentially to expose the semiconductor fins 320. The sacrificial semiconductor layers 314 are then removed to expose the channel layers, i.e., the semiconductor layers 316. The replacement gate structures 374 are then formed around the semiconductor layers 316. A gate dielectric layer 370 is formed on the semiconductor layers 316 and a gate electrode layer 372 is formed on the gate dielectric layer 370. The gate dielectric layer 370 and the gate electrode layer 372 may be referred to as a replacement gate structure 374.

The gate dielectric layer 370 may be formed by CVD, ALD or any suitable method. In one embodiment, the gate dielectric layer 370 is formed using a highly conformal deposition process such as ALD. The gate dielectric layer 370 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode layer 372 is formed on the gate dielectric layer 370. The gate electrode layer 372 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 372 may be formed by CVD, ALD, electro-plating, or other suitable method.

The semiconductor device 300 is a GAA device. The method 100 may be used to fabricate a FinFET device as well.

Embodiments of the present disclosure may also be used in form isolation structures in a CMODE process. The CMODE process is similar to the CPODE process described above except that a replacement gate process, e.g., operation 122 in the method 100, is performed before forming isolation structures, e.g. operations 108-120 in the method 100.

Various embodiments or examples described herein offer multiple advantages over the state-of-art technology. The methods according to the present disclosure enables gate pitch scaling in CPODE or CMODE process without photoresist defects or performance loss.

It will be understood that not all advantages have been necessarily discussed herein, no particular advantage is required for all embodiments or examples, and other embodiments or examples may offer different advantages.

Some embodiments of the present provide a semiconductor device. The semiconductor device comprises a semiconductor substrate; a fin structure on the semiconductor substrate and extending along a first direction; a plurality of gate structures across the fin structure along a second direction; a plurality of source/drain regions over the fin structure and between the plurality of gate structures; a first isolation structure formed in a first gate structure of the plurality of gate structures, wherein the first isolation structure has a first length along the second direction; and a second isolation structure formed in a second gate structure of the plurality of the gate structures, wherein the second isolation structure has a second length along the second direction, the first gate structure is positioned immediately next to the second gate structure, and the first length is shorter than the second length.

Some embodiments of the present provide a semiconductor device. The semiconductor device comprises a semiconductor substrate; a plurality of fin structures on the semiconductor substrate and extending along a first direction; a first gate structure disposed across the plurality of fin structures and extending along a second direction; a second gate structure disposed across the plurality of fin structures and extending along the second direction; a first isolation structure disposed in the first gate structure, wherein the first isolation structure has a first length along the second direction; and a second isolation structure disposed in the second gate structure, wherein the second isolation structure comprises; a first segment having a first width along the first direction; a second segment having a second width along the first direction and a second length along the second direction, wherein the first width is greater than the second width; and a third segment having the first width, wherein the second segment is disposed between the first and third segments, and the first isolation structure overlaps with the second segment of the second isolation structure.

Some embodiments provide a method for forming a semiconductor device. The method comprises: forming a plurality of fin structures on a substrate along a first direction; forming a plurality of gate structures across the plurality of fin structures; depositing a mask layer over the plurality of gate structures; forming a pattern in the mask layer, wherein the pattern comprises: a first opening in align with a first gate structure of the plurality of gate structures, wherein the first opening has a first length along the second direction; and a second opening in align with the second gate structure of the plurality of gate structures, wherein the first gate structures and the second gate structure are immediately next to each other, the second opening has a second length greater than the first length, and the second opening includes: a narrow segment; first wide segment and second wide segment extending from the narrow segment, wherein and the first opening overlaps with the narrow segment of the second opening; forming a first isolation opening and a second isolation opening using the pattern in the mask layer; and depositing a dielectric layer to fill the first isolation opening and the second isolation opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:

a semiconductor substrate;

a fin structure on the semiconductor substrate and extending along a first direction;

a plurality of gate structures across the fin structure along a second direction;

a plurality of source/drain regions over the fin structure and between the plurality of gate structures;

a first isolation structure formed in a first gate structure of the plurality of gate structures, wherein the first isolation structure has a first length along the second direction; and a second isolation structure formed in a second gate structure of the plurality of the gate structures, wherein the second isolation structure has a second length along the second direction, the first gate structure is positioned immediately next to the second gate structure, and the first length is shorter than the second length.

2. The semiconductor device of claim 1, wherein the first isolation structure has a first width along the first direction, the second isolation structure comprises:

a narrow segment having a second width along the first direction;

a wide segment extending from the narrow segment, wherein the second width is less than the first width, and the narrow segment overlaps with the first isolation structure along the second direction.

3. The semiconductor device of claim 2, wherein the plurality of gate structures are evenly distributed along the first direction at a gate pitch, and the first length is greater than 0.5 times of the gate pitch.

4. The semiconductor device of claim 3, wherein the first length is in a range between about 2 times and 10 times of the gate pitch.

5. The semiconductor device of claim 4, wherein the narrow segment of the second isolation structure has a third length along the second direction, and the third length is equal to or greater than the first length.

6. The semiconductor device of claim 2, wherein the first isolation structure cuts through the fin structure and extends into the semiconductor substrate for a first depth, the narrow segment of the second isolation structure cuts through the fin structure and extends into the semiconductor substrate for a second depth, and the first depth is greater than the second depth.

7. The semiconductor device of claim 1, wherein the fin structure includes a single channel.

8. The semiconductor device of claim 1, wherein the fin structure includes two or more channels.

9. A semiconductor device, comprising:
- a semiconductor substrate;
- a plurality of fin structures on the semiconductor substrate and extending along a first direction;
- a first gate structure disposed across the plurality of fin structures and extending along a second direction;
- a second gate structure disposed across the plurality of fin structures and extending along the second direction;
- a first isolation structure disposed in the first gate structure, wherein the first isolation structure has a first length along the second direction; and
- a second isolation structure disposed in the second gate structure, wherein the second isolation structure comprises:
  - a first segment having a first width along the first direction;
  - a second segment having a second width along the first direction and a second length along the second direction, wherein the first width is greater than the second width; and
  - a third segment having the first width, wherein the second segment is disposed between the first and third segments, and the first isolation structure overlaps with the second segment of the second isolation structure.

10. The semiconductor device of claim 9, wherein the second length is equal to or greater than the first length.

11. The semiconductor device of claim 10, wherein the first isolation structure has a third width along the first direction, and the third width is greater than the second width.

12. The semiconductor device of claim 11, further comprising a third isolation structure disposed in a third gate structure, wherein the third isolation structure has the first length and the third width, and the first and third isolation structures are disposed on opposite sides of the second isolation structure.

13. The semiconductor device of claim 12, further comprising a third isolation structure disposed in a third gate structure, wherein the second and third isolation structures are disposed on opposite sides of the first isolation structure.

14. The semiconductor device of claim 13, wherein the third isolation structure comprises:
- a first segment having the first width along the first direction;
- a second segment having the second width along the first direction and the second length along the second direction; and
- a third segment having the first width, wherein the second segment is disposed between the first and third segments, and the first isolation structure overlaps with the second segment of the third isolation structure.

15. A method, comprising:
- forming a plurality of fin structures on a substrate along a first direction;
- forming a plurality of gate structures across the plurality of fin structures;
- depositing a mask layer over the plurality of gate structures;
- forming a pattern in the mask layer, wherein the pattern comprises:
  - a first opening in align with a first gate structure of the plurality of gate structures, wherein the first opening has a first length along the second direction; and
  - a second opening in align with the second gate structure of the plurality of gate structures, wherein the first gate structures and the second gate structure are immediately next to each other, the second opening has a second length greater than the first length, and the second opening includes:
  - a narrow segment;
  - first wide segment and second wide segment extending from the narrow segment, wherein and the first opening overlaps with the narrow segment of the second opening;
- forming a first isolation opening and a second isolation opening using the pattern in the mask layer; and
- depositing a dielectric layer to fill the first isolation opening and the second isolation opening.

16. The method of claim 15, wherein depositing the mask layer comprises using the mask layer to apply a tensile stress to the semiconductor substrate.

17. The method of claim 16, wherein forming the first isolation opening and the second isolation opening comprises:
- etching the first and second gate structures to expose the fin structures;
- etching through the fin structures and into the substrate using a passivation-oriented process.

18. The method of claim 17, wherein forming the plurality of gate structures comprises forming a plurality of sacrificial gate structures, and further comprising:
- after depositing the dielectric layer, performing a replacement process.

19. The method of claim 15, wherein the pattern further comprises:
- a third opening in align with a third gate structure, wherein the third opening has the first length, and the first and third openings are disposed on opposite sides of the second opening.

20. The method of claim 15, wherein the pattern further comprises:
- a third opening in align with a third gate structure, wherein the third opening has the second length, and the second and third openings are disposed on opposite sides of the first opening.

* * * * *